US012652911B2

(12) United States Patent (10) Patent No.: US 12,652,911 B2
Lu et al. (45) Date of Patent: Jun. 9, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yanwei Lu, Beijing (CN); Zhuoran Yan, Beijing (CN); Quan Shi, Beijing (CN); Chengjie Qin, Beijing (CN); Yudiao Cheng, Beijing (CN); Shengsen Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 429 days.

(21) Appl. No.: 18/033,558

(22) PCT Filed: Jun. 29, 2022

(86) PCT No.: PCT/CN2022/102429
§ 371 (c)(1),
(2) Date: Apr. 25, 2023

(87) PCT Pub. No.: WO2024/000292
PCT Pub. Date: Jan. 4, 2024

(65) Prior Publication Data
US 2024/0381714 A1 Nov. 14, 2024

(51) Int. Cl.
*H10K 59/131* (2023.01)
*H10K 59/126* (2023.01)
*H10K 59/88* (2023.01)

(52) U.S. Cl.
CPC ......... *H10K 59/131* (2023.02); *H10K 59/126* (2023.02); *H10K 59/88* (2023.02)

(58) Field of Classification Search
None
See application file for complete search history.

(56) References Cited

U.S. PATENT DOCUMENTS

2019/0122943 A1* 4/2019 Lim ........................ H01L 22/32
2020/0211428 A1 7/2020 Wei et al.
(Continued)

FOREIGN PATENT DOCUMENTS

CN 106773414 A 5/2017
CN 107219660 A 9/2017
(Continued)

*Primary Examiner* — Bilkis Jahan
(74) *Attorney, Agent, or Firm* — Ling Wu; Stephen Yang; Ling and Yang Intellectual Property

(57) ABSTRACT

The present disclosure provides a display substrate, which includes a base substrate (101), a first power supply line (321a), a plurality of first signal leads (341), a plurality of test connection traces (342), at least one first connection line (381), and a plurality of test signal access pins (361). At least one first signal lead (341) is electrically connected to at least one test signal access pin (361) through at least one test connection trace (342). The first connection line (381) is located at a side of the plurality of test connection traces (342) and the plurality of test signal access pins (361) close to an edge of the peripheral area in a first direction (X). The first connection line (381) at least extends along a second direction (Y) and is electrically connected to the first power supply line (321a).

20 Claims, 10 Drawing Sheets

(56)　　　　　　References Cited

U.S. PATENT DOCUMENTS

| | | | |
|---|---|---|---|
| 2021/0202658 A1 | 7/2021 | Shim | |
| 2022/0077273 A1* | 3/2022 | Qing | .................... H10K 59/353 |
| 2022/0319937 A1* | 10/2022 | Ai | ........................... H01L 22/32 |

FOREIGN PATENT DOCUMENTS

| | | | |
|---|---|---|---|
| CN | 110047816 | A | 7/2019 |
| CN | 110488547 | A | 11/2019 |
| CN | 110827688 | A | 2/2020 |
| CN | 112838106 | A | 5/2021 |
| CN | 113223455 | A | 8/2021 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/102429 having an international filing date of Jun. 29, 2022, the entire content of which is hereby incorporated by reference.

TECHNICAL FIELD

The present disclosure relates to, but is not limited to, the field of display technology, in particular to a display substrate and a display apparatus.

BACKGROUND

With the constant development of a display technology, more and more types of display products have emerged, e.g., a Liquid Crystal Display (LCD), an Organic Light emitting Diode (OLED) display, a Plasma Display Panel (PDP), and a Field Emission Display (FED).

SUMMARY

The following is a summary of subject matters described herein in detail. The summary is not intended to limit the protection scope of claims.

Embodiments of the present disclosure provide a display substrate and a display apparatus.

In one aspect, an embodiment of the present disclosure provides a display substrate, including a base substrate, a first power supply line, a plurality of first signal leads, a plurality of test connection traces, at least one first connection line, and a plurality of test signal access pins which are disposed on the base substrate. The base substrate at least includes a display area and a peripheral area located at a side of the display area. The first power supply line is located in the peripheral area. The plurality of first signal leads, the plurality of test connection traces, the plurality of test signal access pins and the at least one first connection line are located at a side of the first power supply line away from the display area. At least one first signal lead is electrically connected with at least one test signal access pin through at least one test connection trace. The first connection line is located at a side of the plurality of test connection traces and the plurality of test signal access pins close to an edge of the peripheral area in a first direction, the first connection line extends at least in a second direction and is electrically connected with the first power supply line. The first direction intersects with the second direction.

In some exemplary implementations, in a direction perpendicular to the display substrate, the first connection line, the first power supply line and the plurality of test connection traces are located at a side of the plurality of first signal leads away from the base substrate.

In some exemplary implementations, the first connection line, the first power supply line and the plurality of test connection traces are of a same layer structure.

In some exemplary implementations, an orthographic projection of the first connection line on the base is overlapped with orthographic projections of the plurality of first signal leads on the base substrate.

In some exemplary implementations, the peripheral area at least includes: at least one test signal access area, at least one first auxiliary mark and at least one second auxiliary mark which are located at a side of the display area. The second auxiliary mark is located at a side of the first auxiliary mark away from the test signal access area in the first direction. The first connection line is aligned with the second auxiliary mark in the second direction.

In some exemplary implementations, the first connection line is electrically connected with the second auxiliary mark.

In some exemplary implementations, the first connection line and the second auxiliary mark are of an integrated structure.

In some exemplary implementations, the peripheral area at least includes: at least one test signal access area, at least one first auxiliary mark and at least one second auxiliary mark which are located at a side of the display area. The second auxiliary mark is located at a side of the first auxiliary mark away from the test signal access area in the first direction. The first connection line is located between the first auxiliary mark and the second auxiliary mark in the first direction.

In some exemplary implementations, the display substrate further includes at least one auxiliary power supply pin located between the first auxiliary mark and the second auxiliary mark in the first direction, and the first connection line is electrically connected to the auxiliary power supply pin.

In some exemplary implementations, the at least one first signal lead has a first bending portion protruding toward a side of the second auxiliary mark, the at least one test connection trace is electrically connected with the first bending portion of the first signal lead. An orthographic projection of the first connection line on the base substrate is overlapped with an orthographic projection of the first bending portion of the first signal lead on the base substrate.

In some exemplary implementations, the at least one first signal lead has a first bending portion protruding toward a side of the second auxiliary mark, the at least one test connection trace is electrically connected with the first bending portion of the first signal lead. An orthographic projection of the first connection line on the base substrate is not overlapped with an orthographic projection of the first bending portion of the first signal lead on the base substrate, and the first bending portion of the first signal lead is located at a side of the first connection line close to the test signal access area.

In some exemplary implementations, the first auxiliary mark is electrically connected to an adjacent second auxiliary mark through a third connection line.

In some exemplary implementations, the first auxiliary mark, the third connection line and the second auxiliary mark are of an integrated structure.

In some exemplary implementations, the peripheral area further includes a first area located between the display area and the test signal access area. The plurality of test signal access pins are located in the test signal access area, and the first power supply line, the plurality of first signal leads and the plurality of test connection traces are at least located in the first area.

In some exemplary implementations, the peripheral area further includes: a signal access area located at a side of the display area in the second direction, the signal access area is adjacent to the test signal access area in the first direction. The signal access area includes a plurality of signal access pins arranged on the base substrate. The at least one first signal lead is electrically connected with at least one signal access pin.

In some exemplary implementations, the display substrate further includes a second connection line electrically connected to the first power supply line, the second connection line is located at a side of the plurality of first signal leads away from the display area.

In some exemplary implementations, the second connection line and the first power supply line are of an integrated structure.

In some exemplary implementations, the display substrate further includes a first peripheral power supply connection line electrically connected with the first power supply line, wherein the first peripheral power supply connection line is located at a side of the first power supply line close to the base substrate. The second connection line and the first peripheral power supply connection line are of an integrated structure.

In some exemplary implementations, the plurality of first signal leads are configured to transmit at least one of the following signals: a scan start signal, a scan clock signal, a light emitting start signal, a light emitting clock signal, a drive power supply signal, a test data signal, and a test control signal.

In another aspect, an embodiment of the present disclosure provides a display apparatus, which includes the aforementioned display substrate.

Other aspects may be understood upon reading and understanding the drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure, but not to constitute limitations on the technical solutions of the present disclosure. Shapes and sizes of one or more components in the drawings do not reflect true scales, but are only intended to schematically describe contents of the present disclosure.

DETAILED DESCRIPTION

Figure 1:
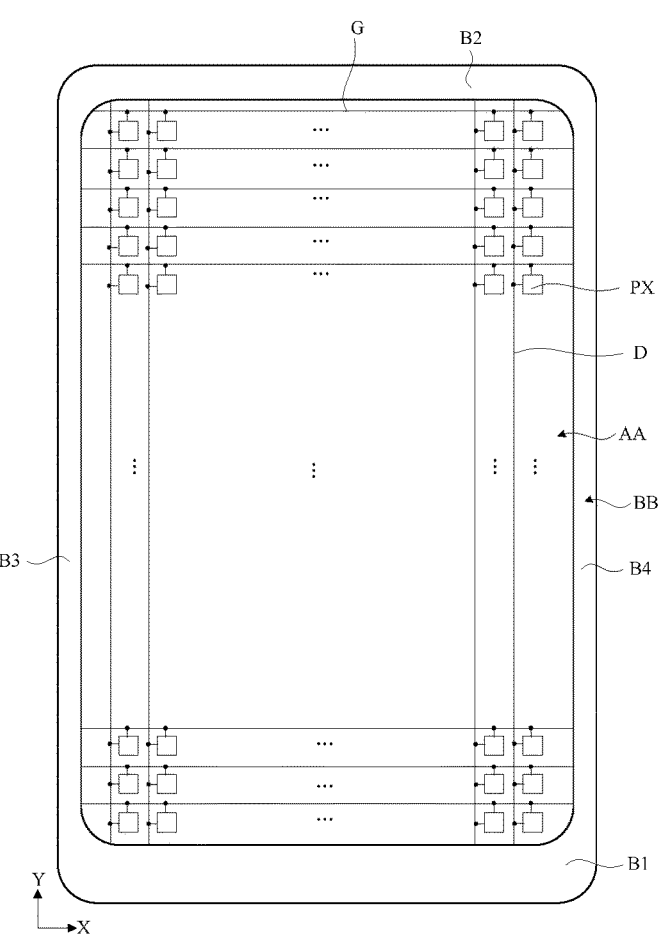
FIG. 1 is a schematic diagram of an appearance of a display apparatus.

The embodiments of the present disclosure will be described below in combination with the drawings in detail. Implementations may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementations only. The embodiments in the present disclosure and features in the embodiments may be combined randomly with each other without conflict.

In the drawings, a size of one or more constituent elements, a thickness of a layer, or an area is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, "a plurality of" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between constituent elements are changed as appropriate according to a direction in which the constituent elements are described.

Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with some electrical effect. "An element having some electrical effect" is not particularly limited as long as electrical signals between the connected constituent elements may be transmitted. Examples of "an element having some electrical effect" not only include an electrode and a wiring, but further include a switch element such as a transistor, a resistor, an inductor, a capacitor, another element with a plurality of functions, etc.

In the specification, a transistor refers to an element which at least includes three terminals, i.e., a gate, a drain, and a source. The transistor has a channel area between the drain electrode (drain electrode terminal, drain area, or drain) and the source electrode (source electrode terminal, source area, or source), and a current may flow through the drain, the channel area, and the source. In the specification, the channel area refers to an area through which a current mainly flows.

In this specification, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In a case that transistors with opposite polarities are used, or in a case that a direction of a current changes during operation of a circuit, or the like, functions of the "source electrode" and the "drain electrode" may sometimes be exchangeable. Therefore, the "source electrode" and the "drain electrode" may be exchangeable in the specification.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be chamfer, arc edge and deformation, etc.

In the present disclosure, "about" and "substantially" refer to a case that a boundary is not defined strictly and a process and measurement error within a range is allowed. In the present disclosure, "substantially the same" is a case where values differ by less than 10%.

In the present disclosure, "A extends in/along a B direction" means that A may include a main portion, which is a line, a line segment or a strip-shaped body, and a secondary portion connected with the main portion, wherein the main portion extends in the B direction, and a length of the main portion extending in the B direction is greater than a length of the secondary portion extending in another direction. In the following description, "A extends in/along a B direction" means "the main body portion of A extends in/along a B direction".

FIG. 1 is a schematic diagram of the appearance of a display apparatus, which has a rectangular shape with rounded chamfers. The display apparatus may include a display substrate. In some examples, the display substrate may be a closed polygon including linear edges, a circle or an ellipse including a curved edge, a semicircle or semi-ellipse including a linear edge and a curved edge, or the like. In some examples, when the base substrate has a linear edge, at least some corners of the base substrate may be curved. When the base substrate is in a shape of a rectangle, a portion at a position where adjacent linear edges intersect with each other may be replaced by a curve with a predetermined curvature. Among them, the curvature may be set according to different positions of the curve. For example, the curvature may be changed according to a starting position of the curve, a length of the curve, etc.

In some examples, as shown in FIG. 1, the display substrate may include a display area AA and a peripheral area BB located at a periphery of the display area AA. In some examples, the display area AA may include a first edge (lower edge) and a second edge (upper edge) oppositely disposed in the second direction Y, and a third edge (left edge) and a fourth edge (right edge) oppositely disposed in the first direction X. Adjacent edges can be connected by an arc chamfer to form a quadrilateral shape with rounded chamfers. In some examples, the peripheral area BB may include a first bezel (lower bezel) B1 and a second bezel (upper bezel) B2 oppositely disposed in the second direction Y, and a third bezel (left bezel) B3 and a fourth bezel (right bezel) B4 oppositely disposed in the first direction X. The first bezel B1 is in communication with the third bezel B3 and the fourth bezel B4, and the second bezel B2 is in communication with the third bezel B3 and the fourth bezel B4.

In some exemplary implementations, as shown in FIG. 1, the display area AA at least includes a plurality of sub-pixels PX, a plurality of gate lines G and a plurality of data lines D. The plurality of gate lines G may extend along the first direction X and the plurality of data lines D may extend along the second direction Y. Orthographic projections of the plurality of gate lines G on the base substrate intersect with orthographic projections of the plurality of data lines D on the base substrate to form a plurality of sub-pixel areas, and one sub-pixel PX is disposed in each sub-pixel area. The plurality of data lines D are electrically connected with a plurality of sub-pixels PX and may be configured to provide data signals to the plurality of sub-pixels PX. The plurality of gate lines G are electrically connected with the plurality of sub-pixels PX and may be configured to provide gate control signals to the plurality of sub-pixels PX. In some examples, the gate control signal may include a scan signal and a light emitting control signal.

In some examples, as shown in FIG. 1, the first direction X may be an extension direction of the gate line G in the display area (row direction), and the second direction Y may be an extension direction of the data line D in the display area (column direction). The first direction X and the second direction Y may be perpendicular to each other.

In some examples, a pixel unit of the display area AA may include three sub-pixels which are a red sub-pixel, a green sub-pixel, and a blue sub-pixel respectively. However, the embodiment is not limited thereto. In some examples, a pixel unit may include four sub-pixels, and the four sub-pixels may be a red sub-pixel, a green sub-pixel, a blue sub-pixel, and a white sub-pixel respectively.

In some examples, the sub-pixel may be shaped in a rectangle, a rhombus, a pentagon, or a hexagon. When a pixel unit includes three sub-pixels, the three sub-pixels may be arranged in parallel in a horizontal direction, in parallel in a vertical direction, or in a form of delta-shaped. When a pixel unit includes four sub-pixels, the four sub-pixels may be arranged in parallel in a horizontal direction, in parallel in a vertical direction, or in a square. However, the embodiment is not limited thereto.

In some examples, a sub-pixel may include a pixel circuit and a light emitting element electrically connected with the pixel circuit. The pixel circuit may include a plurality of transistors and at least one capacitor. For example, the pixel circuit may be of a 3T1C (three transistors and one capacitor) structure, a 7T1C (seven transistors and one capacitor) structure, a 5T1C (five transistors and one capacitor) structure, an 8T1C (eight transistors and one capacitor) structure, or an 8T2C (eight transistors and two capacitors) structure.

In some examples, a light emitting element may be any one of a Light Emitting Diode (LED), an Organic Light emitting Diode (OLED), a Quantum Dot Light emitting Diode (QLED), and a Micro LED (including mini-LED or micro-LED). For example, the light emitting element may be an OLED, and the light emitting element may emit red light, green light, blue light, or white light, etc. under drive of its corresponding pixel circuit. A color of light emitted from the light emitting element may be determined as needed. In some examples, the light emitting element may include an anode, a cathode, and an organic light emitting layer located between the anode and the cathode. The anode of the light emitting element may be electrically connected with a corresponding pixel circuit. However, the embodiment is not limited thereto.

Figure 2:
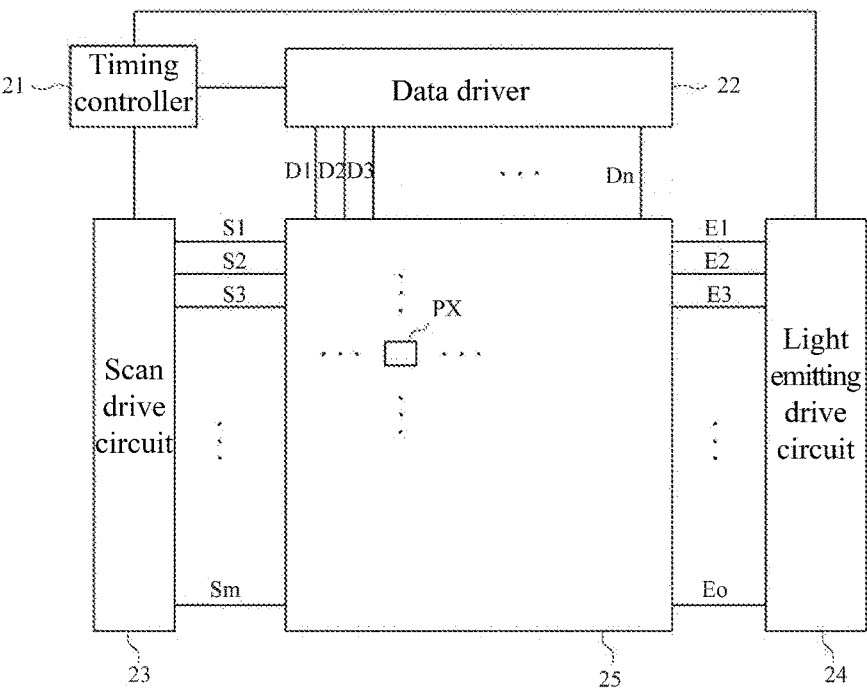
FIG. 2 is a schematic diagram of a structure of a display apparatus.

FIG. 2 is a schematic diagram of a structure of a display apparatus. In some examples, as shown in FIG. 2, the display apparatus may include a timing controller 21, a data driver 22, a scan drive circuit 23, a light emitting drive circuit 24 and a display substrate. In some examples, the display area of the display substrate may include a plurality of sub-pixels PX arranged regularly. The scan drive circuit 23 may be configured to supply a scan signal to a sub-pixel PX along a scan line. The data driver 22 may be configured to supply a data voltage to a sub-pixel PX along a data line. The light emitting drive circuit 24 may be configured to supply a light emitting control signal to a sub-pixel PX along a light emitting control line. The timing controller 21 may be configured to control the scan drive circuit 23, the light emitting drive circuit 24 and the data driver 22.

In some examples, the timing controller 21 may provide a gray-scale value and a control signal suitable for a specification of the data driver 22 to the data driver 22. The timing controller may provide a clock signal, a scan start signal, etc., suitable for a specification of the scan drive circuit 23 to the scan drive circuit 23. The timing controller 21 may provide a light emitting clock signal, a light emitting start signal, etc., suitable for a specification of the light emitting drive circuit 24 to the light emitting drive circuit 24. The data driver 22 may generate a data voltage, which will be provided to data lines D1 to Dn, using the gray-scale value and the control signal received from the timing controller 21.

For example, the data driver 22 may sample the gray-scale value using the clock signal and apply the data voltage corresponding to the gray-scale value to the data lines D1 to Dn by using a sub-pixel row as a unit. The scan circuit 23 may receive the scan clock signal, the scan start signal, etc., from the timing controller 21 to generate a scan signal to be provided to scan lines S1 to Sm. For example, the scan drive circuit 23 may sequentially provide scan signals with on-level pulses to scan lines. In some examples, the scan driver 23 may include a shift register and sequentially transmit the scan start signal provided in form of an on-level pulse to a next-stage circuit to generate the scan signal under the control of the scan clock signal. The light emitting drive circuit 24 may receive the light emitting clock signal, the light emitting start signal, etc., from the timing controller 21 to generate a light emitting control signal to be provided to light emitting control lines E1 to Eo. For example, the light emitting drive circuit 24 may provide sequentially light emitting control signals with an off-level pulse to light emitting control lines. The light emitting drive circuit 24 may include a shift register, and generate a light emitting control signal by sequentially transmitting a light emitting initial signal provided in a form of an off-level pulse to a next-stage circuit under control of the clock signal. Among them, n, m, and o are all natural numbers.

In some examples, the scan drive circuit and the light emitting drive circuit may be directly disposed on the display substrate. For example, the scan drive circuit may be disposed at the third bezel of the display substrate, and the light emitting drive circuit may be disposed at the fourth bezel of the display substrate. Or, the third bezel and the fourth bezel of the display substrate may be both provided with the scan drive circuit and the light emitting drive circuit. In some examples, the scan drive circuit and the light emitting drive circuit may be formed together with the sub-pixels in a process of forming the sub-pixels.

In some examples, the data driver may be disposed on an independent chip or printed circuit board to be connected to the sub-pixel through the signal access pin on the display substrate. For example, the data driver may be formed and disposed at the first bezel of the display substrate using a chip on glass, a chip on plastics, a chip on film, etc., to be connected to the signal access pin. The timing controller may be arranged separately from or integrally with the data driver. However, the embodiment is not limited thereto. In some examples, the data driver may be directly disposed on the display substrate.

Figures 3, 4:
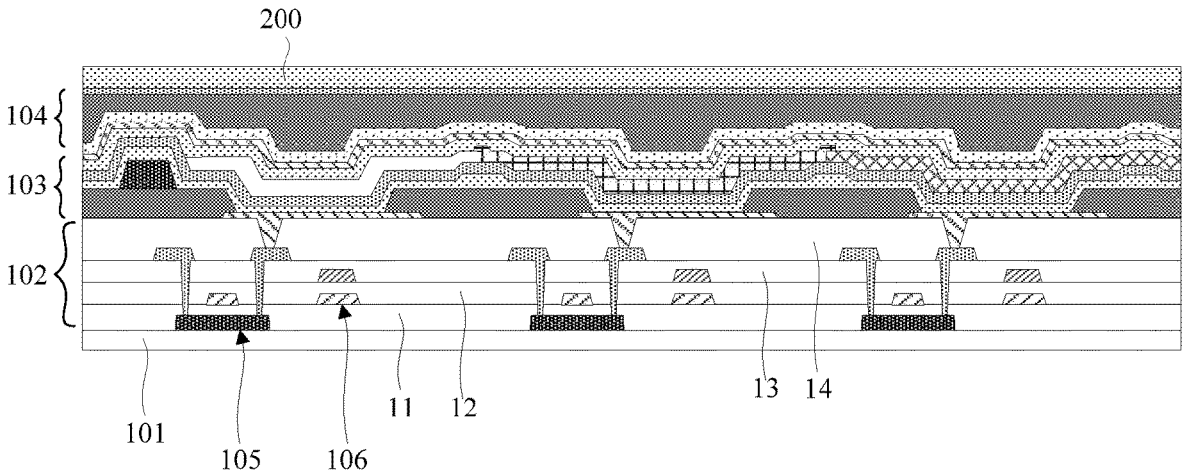
FIG. 3 is a schematic diagram of a partial sectional structure of a display area of a display substrate.
FIG. 4 is an equivalent circuit diagram of a pixel circuit.

FIG. 3 is a schematic diagram of a partial sectional structure of a display area of a display substrate. FIG. 3 illustrates structures of three sub-pixels of the display substrate. In some example, as shown in FIG. 3, in a direction perpendicular to the display substrate, the display substrate may include: a base substrate 101, and a circuit structure layer 102, a light emitting structure layer 103, an encapsulation layer 104 and an encapsulation cover plate 200 that are sequentially disposed on the base substrate 101. In some possible implementations, the display substrate may include another film layer, such as a post spacer, which is not limited in the present disclosure.

In some examples, the base substrate 101 may be a rigid substrate, e.g., a glass substrate. However, the embodiment is not limited thereto. For example, the base substrate may be a flexible substrate, e.g., prepared from an insulation material like a resin. In addition, the base substrate may be a single-layer structure or a multilayer structure. When the base substrate is a multilayer structure, an inorganic material such as silicon nitride, silicon oxide, and silicon oxynitride may be arranged between a plurality of layers as a single layer or multiple layers.

In some examples, the circuit structure layer 102 of each sub-pixel may include a plurality of transistors and a storage capacitor which form a pixel circuit. Illustration is made in FIG. 3 by taking each sub-pixel including one transistor and one storage capacitor as an example. In some possible implementations, the circuit structure layer 102 of each sub-pixel may include: an active layer disposed on the base substrate 101; a first insulation layer 11 covering the active layer; a first gate metal layer (including, for example, a gate electrode and a first capacitor electrode) disposed on the first insulation layer 11; a second insulation layer 12 covering the first gate metal layer; a second gate metal layer (e.g. including a second capacitor electrode) disposed on the second insulation layer 12; a third insulation layer 13 covering the second gate metal layer, wherein the first insulation layer 11, the second insulation layer 12 and the third insulation layer 13 are provided with vias, and the vias expose the active layer; a first source-drain metal layer (including, for example, a source electrode and a drain electrode of a transistor) disposed on the third insulation layer 13, wherein the source electrode and the drain electrode may be connected to the active layer through a via, respectively; and a first planarization 14 covering the structure, wherein the first planarization 14 is provided with a via, the via exposes the drain electrode. The active layer, the gate electrode, the source electrode, and the drain electrode may form the transistor 105, and the first capacitance electrode and the second capacitance electrode may form the storage capacitor 106.

In some examples, the light emitting structure layer 103 may include an anode layer, a pixel definition layer, an organic light emitting layer, and a cathode. The anode layer may include an anode of the light emitting element, the anode is disposed on the planarization layer and is connected with the drain electrode of the transistor of the pixel circuit through a via provided on the planarization layer; the pixel definition layer is disposed on the anode and the planarization layer, and a pixel opening is provided on the pixel definition layer and exposes the anode; the organic light emitting layer is at least partially disposed in the pixel opening and is connected with the anode; the cathode is disposed on the organic light emitting layer and is connected with the organic light emitting layer; and the organic light emitting layer emits light of a corresponding color under drive of the anode and the cathode.

In some examples, the encapsulation structure layer 104 may include a first encapsulation layer, a second encapsulation layer, and a third encapsulation layer that are stacked. The first encapsulation layer and the third encapsulation layer may adopt an inorganic material, and the second encapsulation layer may adopt an organic material. The second encapsulation layer is disposed between the first encapsulation layer and the third encapsulation layer, which can ensure that outside water vapor cannot enter the light emitting structure layer 103.

In some examples, the organic light emitting layer may at least include a hole injection layer, a hole transport layer, a light emitting layer and a hole block layer which are stacked on the anode. In some examples, the hole injection layers of all sub-pixels may be a common layer connected together; the hole transport layers of all sub-pixels may be a common layer connected together; the light emitting layers of adjacent sub-pixels may be slightly overlapped or isolated; and the hole block layers may be a common layer connected together. However, the embodiment is not limited thereto.

FIG. 4 is an equivalent circuit diagram of a pixel circuit. In some examples, as shown in FIG. 4, the pixel circuit of this example may include seven transistors (i.e. a first transistor T1 to a seventh transistor T7) and one storage capacitor Cst. A gate of the third transistor T3 is electrically connected with a first node N1, a first electrode of the third transistor T3 is electrically connected with a second node N2, and a second electrode of the third transistor T3 is connected with the third node N3. The third transistor T3 may be referred to as a drive transistor. A gate of the fourth transistor T4 is electrically connected with the first scan line GL, a first electrode of the fourth transistor T4 is electrically connected with the data line DL, and a second electrode of the fourth transistor T4 is electrically connected with the first electrode of the third transistor T3. The fourth transistor T4 may be referred to as a data writing transistor. A gate of the second transistor T2 is electrically connected with the first scan line GL, a first electrode of the second transistor T2 is electrically connected with a gate of the third transistor T3, and a second electrode of the second transistor T2 is electrically connected with a second electrode of the third transistor T3. The second transistor T2 may also be referred to as a threshold compensation transistor. A gate of the fifth transistor T5 is electrically connected with the light emitting control line EML, a first electrode of the fifth transistor T5 is electrically connected with the second power supply line VDD, and a second electrode of the fifth transistor T5 is electrically connected with the first electrode of the third transistor T3. A gate of the sixth transistor T6 is electrically connected with the light emitting control line EML, a first electrode of the sixth transistor T6 is electrically connected with the second electrode of the third transistor T3, and a second electrode of the sixth transistor T6 is electrically connected with an anode of the light emitting element EL. The fifth transistor T5 and the sixth transistor T6 may be referred to as light emitting control transistors. The first transistor T1 is electrically connected with the gate of the third transistor T3 and configured to reset the gate of the third transistor T3, and the seventh transistor T7 is electrically connected with the anode of the light emitting element EL and configured to reset the anode of the light emitting element EL. A gate of the first transistor T1 is electrically connected with a second scan line RST1, a first electrode of the first transistor T1 is electrically connected with a first initial signal line INIT1, and a second electrode of the first transistor T1 is electrically connected with the gate of the third transistor T3. A gate of the seventh transistor T7 is connected with the third scan line RST2, a first electrode of the seventh transistor T7 is connected with the second initial signal line INIT2, and a second electrode of the seventh transistor T7 is connected with the anode of the light emitting element EL. The first transistor T1 and the seventh transistor T7 may also be referred to as reset control transistors. A first capacitor plate of the storage capacitor Cst is electrically connected with the gate of the third transistor T3, and a second capacitor plate of the storage capacitor Cst is electrically connected with the second power supply line VDD.

In this example, the first node N1 is a connection point for the storage capacitor Cst, the first transistor T1, the third transistor T3 and the second transistor T2, the second node N2 is a connection point for the fifth transistor T5, the fourth transistor T4, and the third transistor T3, the third node N3 is a connection point for the third transistor T3, the second transistor T2, and the sixth transistor T6, the fourth node N4 is a connection point for the sixth transistor T6, the seventh transistor T7, and the light emitting element EL.

In some examples, the first transistor T1 to the seventh transistor T7 may be P-type transistors or may be N-type transistors. Use of a same type of transistors in a pixel drive circuit may simplify a process flow, reduce process difficulties of a display panel, and improve a product yield. In some possible implementations, the first transistor T1 to the seventh transistor T7 may include P-type transistors and N-type transistors.

In some examples, the second power supply line VDD may be configured to provide a constant second voltage signal for a pixel circuit, the first power supply line VSS may be configured to provide a constant first voltage signal to a pixel circuit, wherein the second voltage signal may be greater than the first voltage signal. The first scan line GL may be configured to provide a scan signal SCAN to the pixel circuit, the data line DL may be configured to provide a data signal DATA to the pixel circuit, the light emitting control line EML may be configured to provide a light emitting control signal EM to the pixel circuit, the second scan line RST1 may be configured to provide a first reset control signal RESET1 to the pixel circuit, and the third scan line RST2 may be configured to provide a second reset control signal RESET2 to the pixel circuit. In some examples, a second scan line RST1 for an n-th row of pixel circuits may be electrically connected with a first scan line GL for an (n−1)-th row of pixel circuits, so as to be inputted with a scan signal SCAN (n−1), that is, a first reset control signal RESET1(n) is the same as the scan signal SCAN(n−1). A third scan line RST2 for the n-th row of pixel circuits may be electrically connected with a first scan line GL for the n-th row of pixel circuits, so as to be inputted with a scan signal SCAN(n), that is, a second reset control signal RESET2(n) may be the same as the scan signal SCAN(n−1). Herein, n is an integer greater than 0. Thus, signal lines of the display substrate may be reduced, and a narrow bezel design of the display substrate may be achieved. However, the embodiment is not limited thereto.

In some examples, the first initial signal line INIT1 may be configured to provide a first initial signal to the pixel circuit, the second initial signal line INIT2 may be configured to provide a second initial signal to the pixel circuit. For example, the first initial signal may be different from the second initial signal. The first initial signal and the second initial signal may be constant voltage signals, and their magnitudes may be between a first voltage signal and a second voltage signal, but not limited to this. In some other examples, the first initial signal is the same as the second initial signal line, therefore, it is possible to provide only the first initial signal line to supply the first initial signal.

In some implementations, internal traces of the display substrate are damaged due to static electricity during a reliability test. In order to improve the antistatic discharge capability of the display substrate, an electrostatic discharge (ESD) unit may be connected to the internal traces. However, more than one ESD unit is generally needed for longer traces. When the internal space of the display substrate is limited, there is not enough space to arrange enough ESD units, which leads to the inability to effectively improve the antistatic ability of the display substrate, and there is still an ESD NG phenomenon.

The embodiment provides a display substrate, including a base substrate, a first power supply line, a plurality of first signal leads, a plurality of test connection traces, at least one first connection line, and a plurality of test signal access pins which are disposed on the base substrate. The base substrate at least includes a display area and a peripheral area located at a side of the display area. The first power supply line is located at the peripheral area. A plurality of first signal leads, a plurality of test connection traces, a plurality of test signal access pins and at least one first connection line are located at a side of the first power supply line away from the display area. At least one first signal lead is electrically connected with at least one test signal access pin through at least one test connection trace. The first connection line is located at a side of the plurality of test connection traces and the plurality of test signal access pins close to an edge of the peripheral area in a first direction, the first connection line extends at least in a second direction and is electrically connected with the first power supply line. The first direction intersects with the second direction, for example, the first direction is perpendicular to the second direction.

In the display substrate provided by the embodiment, a first connection line electrically connected to the first power supply line is provided, and the first connection line is positioned outside the plurality of test connection traces and the plurality of test signal access pins in the first direction to provide an electrostatic lead-out channel, thereby protecting the test signal access pins and the signal traces electrically connected to the test signal access pins. The embodiment can effectively improve the antistatic ability of the display substrate.

In some exemplary implementations, the first connection line, the first power supply line and the plurality of the test connection traces are located at a side of the plurality of first signal leads away from the base substrate in a direction perpendicular to the display substrate. For example, the first connection line, the first power supply line, and the plurality of test connection traces may be of a same layer structure, for example, they may be located in the first source-drain metal layer. The plurality of first signal leads may be located in the first gate metal layer.

In some exemplary implementations, an orthographic projection of the first connection line on the base substrate may be overlapped with orthographic projections of the plurality of first signal leads on the base substrate.

Figure 5:
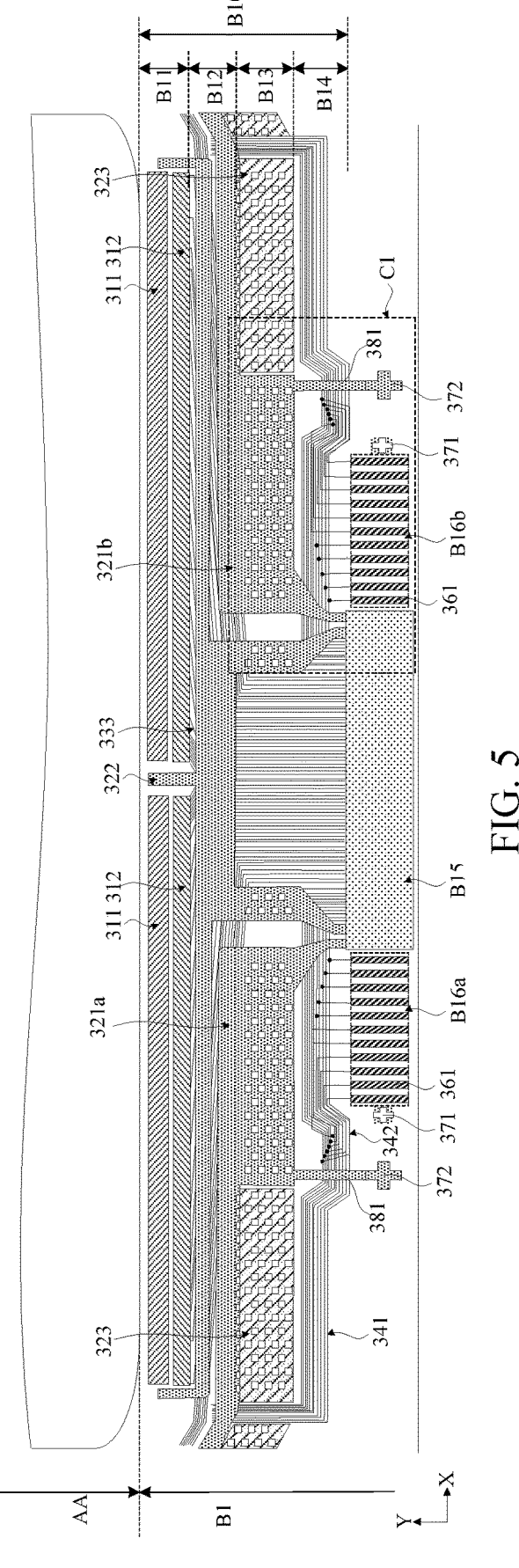
FIG. 5 is a schematic diagram of a first bezel of a display substrate according to at least one embodiment of the present disclosure.

FIG. 5 is a schematic diagram of a first bezel of a display substrate according to at least one embodiment of the present disclosure. In some examples, as shown in FIG. 5, the first bezel (lower bezel) B1 of the display substrate may at least include a signal access area B15 and two test signal access areas (e.g. a first test signal access area B16a and a second test signal access area B16b) which are located at a side of the display area AA, and a first area B10 located between the signal access area B15 and the display area AA. The signal access area B15 and the two test signal access areas may be adjacent in the first direction X. For example, two test signal access areas may be located at two opposite sides of the signal access area B15 in the first direction X. For example, the first test signal access area B16a may be located at the left side of the signal access area B15 in the first direction X, and the second test signal access area B16b may be located at the right side of the signal access area B15 in the first direction X. However, the embodiment is not limited thereto. In another some examples, it is possible to provide only one test signal access area adjacent to the signal access area. In this example, the test signal access area is remained in the display substrate.

In some examples, as shown in FIG. 5, the first area B10 may include a peripheral circuit area B11, a fan-out trace area B12, an encapsulation area B13, and a test trace area B14 sequentially disposed in the second direction Y along a direction away from the display area AA. The signal access area B15, the first test signal access area B16a, and the second test signal access area B16b may be located at a side of the test trace area B14 away from the encapsulation area B13. The encapsulation area B13 may be an area where encapsulation adhesive is coated or printed. In some examples, the encapsulation area B13 may be an annular area surrounding the display area AA, thereby facilitating improvement of encapsulation effects.

In some examples, as shown in FIG. 5, the peripheral circuit area B11 of the first bezel B1 may be provided with a multiplexing circuit (MUX) 311 and an electrostatic discharge (ESD) circuit 312. The electrostatic discharge circuit 312 may be located at a side of the multiplexing unit 311 away from the display area AA. The multiplexing circuit 311 may include a plurality of multiplexing units, each multiplexing unit may be electrically connected with a plurality of data lines in the display area 10 and may be configured such that one signal source may provide data signals to the plurality of data lines. For example, each multiplexing unit may be electrically connected to one multiplexing data line, and the multiplexing unit may be electrically connected to the signal source providing the data signal through the multiplexing data line. The multiplexing data line may be electrically connected to the electrostatic discharge circuit 312 to discharge static electricity.

In some examples, as shown in FIG. 5, the fan-out trace area B12 may be provided with a plurality of data fan-out lines 333. The plurality of data fan-out lines 333 may be electrically connected to a plurality of multiplexing data lines of the peripheral circuit area B11. For example, a plurality of data fan-out lines 333 may be electrically connected to a plurality of multiplexing data lines in one-to-one correspondence. A plurality of data fan-out lines may extend to the signal access area B15 and are electrically and correspondingly connected to a plurality of first signal access pins within the signal access area B15. In some examples, the plurality of data fan-out lines 333 may be of a same layer structure, for example, they may be located in the first gate metal layer.

In some examples, as shown in FIG. 5, the first area B10 is further provided with first power supply lines 321a and 321b, and a second power supply line 322. The first power supply line 321a may extend to the third bezel, and the first power supply line 321b may extend to the fourth bezel. For example, the first power supply lines 321a and 321b may be connected within the second bezel to form an integrated structure. The first power supply lines 321a and 321b may be configured to connect a low-potential power supply line to transmit a first voltage signal. The second power supply line 322 may be configured to connect a high-potential power supply line of the display area AA to transmit a second voltage signal. The first power supply lines 321a and 321b may be located at opposite sides of the second power supply line 322 in the first direction X. The first power supply lines 321a and 321b may each extend to the signal access area B15 and be electrically connected to a first power supply access pin of the signal access area B15, and the second power supply line 322 may extend to the signal access area B15 and be electrically connected to a second power supply access pin of the signal access area B15. In some examples, the first power supply lines 321a and 321b, and the second power supply line 322 may be of a same layer structure, for example, they may be located in the first source-drain metal layer. The first power supply lines 321a and 321b and the second power supply line 322 and the plurality of data fan-out lines 333 may be arranged in different layers. Orthographic projections of the first power supply lines 321a and 321b on the base substrate may be partially overlapped with orthographic projections of the plurality of data fan-out lines 333 on the base substrate, and an orthographic projection of the second power supply line 322 on the base substrate may be partially overlapped with orthographic projections of the plurality of data fan-out lines 333 on the base substrate.

In some examples, as shown in FIG. 5, the first power supply lines 321a and 321b and the second power supply line 322 may extend from the fan-out trace area B12, through the encapsulation area B13, to the test trace area B14. The first power supply lines 321a and 321b located in the encapsulation area B13 may serve as a first encapsulation adhesive substrate, and the second power supply line 322 located in the encapsulation area B13 may serve as a second encapsulation adhesive substrate. In other words, the first adhesive substrate may be electrically connected to the first power supply line 321a or 321b, and the second adhesive substrate may be electrically connected to the second power supply line 322. The first encapsulation adhesive substrate and the second encapsulation adhesive substrate may be provided with a plurality of openings. Since a plurality of openings are provided on the encapsulation adhesive substrate, when an encapsulation adhesive is coated on the encapsulation adhesive substrate, the encapsulation adhesive will leak into the openings, which is equivalent to having the encapsulation adhesive on and inside the encapsulation adhesive substrate. Therefore, when the encapsulation adhesive is melted by laser, a bonding strength of the encapsulation adhesive can be further improved, and a bonding force between the base substrate and the encapsulation cover plate can be enhanced, thereby improving the product yield.

In some examples, as shown in FIG. 5, the first area B10 is further provided with a first peripheral power supply connection line 323. The first peripheral power supply connection line 323 may be electrically connected with the first power supply line 321a or 321b. The first peripheral power supply connection line 323 may be located at a side of the first power supply lines 321a and 321b close to the base substrate, for example, it may be located in the first gate metal layer. The first peripheral power supply connection line 323 may be provided with a plurality of vias. The first peripheral power supply connection line 323 may be located at a side of the first power supply line 321a or 321b away from the second power supply line 322 in the first direction X. Illustration is made by an example that the first peripheral power supply connection line 323 and the first power supply line 321a are electrically connected. The first peripheral power supply connection line 323 and the first power supply line 321a are adjacent in the second direction Y, an edge of the first peripheral power supply connection line 323 close to the first power supply line 321a in the second direction Y is provided with a plurality of first protrusions, an edge of the first power supply line 321a close to the first peripheral power supply connection line 323 in the second direction Y is provided with a plurality of second protrusions, and the plurality of second protrusions and the plurality of first protrusions can be electrically connected in one-to-one correspondence to realize the electrical connection between the first peripheral power supply connection line 323 and the first power supply line 321a. In some examples, by increasing the length of the first peripheral power supply connection line 323 in the first direction X, the length of the first power supply line 321a along the first direction X may be reduced. By reducing the length of the first power supply line along the first direction, the situation that the first encapsulation adhesive substrate is easily corroded or cracked under the high temperature and high humidity environment can be improved, thereby improving the product yield.

In some examples, as shown in FIG. 5, the test trace area B14 may be provided with a plurality of first signal leads 341 and a plurality of test connection traces 342. The plurality of first signal leads 341 may extend along the first direction X in the test trace area B14 or may extend in the second direction Y toward a side of the display area AA. For example, the plurality of first signal leads 341 may be electrically connected to the plurality of signal connection lines in the fan-out trace area B12 to further extend to the third bezel and the fourth bezel. A plurality of first signal leads 341 may extend to the signal access area B15 and are electrically connected to a plurality of signal access pins within the signal access area B15. The plurality of first signal leads 341 may be of a same layer structure, for example, they may be located in the first gate metal layer. The plurality of first signal leads 341 may also be electrically connected to a plurality of test signal access pins 361 within the test signal access area B16a or B16b through a plurality of test connection traces 342. For example, the plurality of first signal leads 341 may be electrical connected with the plurality of the test connection traces 342 in one-to-one correspondence. The plurality of test connection traces 342 may be located at a side of the plurality of first signal leads 341 away from the base substrate, for example, the plurality of test connection traces 342 may be located in the first source-drain metal layer.

Figures 7, 8:
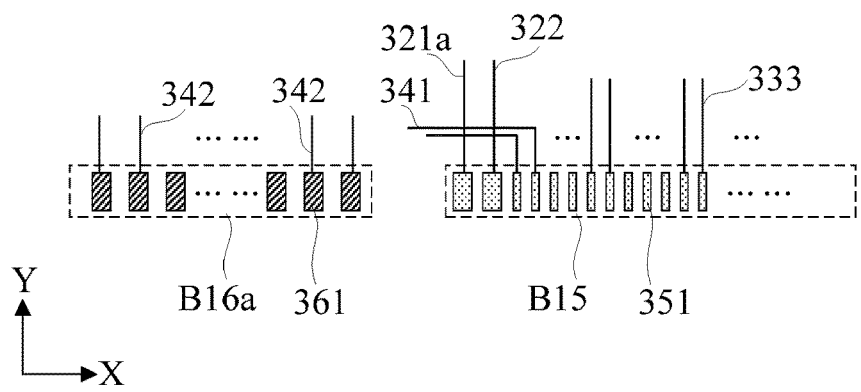
FIG. 7 is a partial diagram of a signal access area and a test signal access area according to at least one embodiment of the present disclosure.
FIG. 8 is an exemplary trace diagram of a peripheral area according to at least one embodiment of the present disclosure.

FIG. 7 is a partial diagram of a signal access area and a test signal access area according to at least one embodiment of the present disclosure. In some examples, as shown in FIG. 7, the signal access area B15 may include a plurality of signal access pins 351 arranged side by side in parallel, and the plurality of signal access pins 351 may be arranged sequentially along the first direction X. The plurality of signal access pins 351 may be configured to form bonding connections with a flexible printed circuit or an integrated circuit, thereby acquiring signals from the flexible circuit board or the integrated circuit. The plurality of signal access pins 351 may include a plurality of first power supply access pins, a plurality of second power supply access pins, and a plurality of first signal access pins. The first power supply access pins may be electrically connected to the first power supply line 321a or 321b. The second power supply access pins may be electrically connected to the second power supply line 322. At least part of the first signal access pins may be electrically connected to a plurality of data fan-out lines 333, and at least part of the first signal access pins may be electrically connected to a plurality of first signal leads 341. In some examples, in the first direction X, the first power supply access pins and the second power supply access pins may be located at two opposite sides of the plurality of first signal access pins. The first power supply access pins may be adjacent to the test signal access area B16a or B16b. In some examples, the lengths of the first power access pin and the second power access pin along the first direction X may be greater than the length of the first signal access pin along the first direction X, and the lengths of the first power access pin, the second power access pin and the first signal access pin along the second direction Y may be the same. In some examples, the dimensions of the first power access pin and the second power access pin may be larger than the dimension of the first signal access pin. However, the embodiment is not limited thereto.

In some examples, as shown in FIG. 7, illustration is made by exemplifying the first test signal access area B16a. The first test signal access area B16a may include a plurality of test signal access pins 361 arranged side by side in parallel, and the plurality of test signal access pins 361 may be sequentially arranged along the first direction X. The plurality of test signal access pins 361 may be arranged in parallel with the plurality of signal access pins 351 in the signal access area B15. The plurality of test signal access pins 361 may be configured to be in contact with a test probe of a test device (e.g. a flexible circuit board) during an Electronic Test (ET), so as to obtain a signal from the test probe. In some examples, the test signal access pins 361 of the first test signal access area B16a may be electrically connected to the test circuit and the scan drive circuit of the bezel area through the test connection trace 342 and the first signal lead 341, and configured to provide the test signal to the test circuit and the scan drive circuit. However, the embodiment is not limited thereto.

In some examples, as shown in FIG. 7, the lengths of the plurality of test signal access pins 361 in the first direction X may be substantially the same, and the lengths of the plurality of test signal access pins 361 in the second direction Y may be substantially the same. The dimensions of the plurality of test signal access pins 361 may be substantially the same. However, the embodiment is not limited thereto.

In some examples, as shown in FIG. 5, a plurality of test signal access pins 361 of the second test signal access area B16b may be electrically connected to the test circuit and the light emitting drive circuit of the bezel area through the test connection trace 342 and the first signal lead 341, and configured to provide a test signal to the test circuit and the light emitting drive circuit. The structure of the test signal access pins of the second test signal access area B16b can be described with reference to the description of the first test signal access area B16a, which will not be described here.

In some examples, the test circuit may include at least one test control signal line, a plurality of test data lines, and a plurality of test units. Each test unit is electrically connected to the test control signal line, the test data lines, and a plurality of data lines of the display area. The test unit may be configured to, according to control of a test control signal line, provide (simultaneously or respectively) signals (test data signals) of test data lines to a plurality of data lines of a display area connected thereto to detect and locate defective sub-pixels in the display area. For example, the test circuit may be located at the second bezel. However, the embodiment is not limited thereto.

In some examples, during the electronic test, a first voltage signal and a second voltage signal may be provided to the display substrate through the first power supply access pins and the second power supply access pins (i.e., the pins connecting the first power supply line and the second power supply line) of the signal access area B15. In this example, during the electronic test, the first power supply access pins of the signal access area B15 can be borrowed to provide the first voltage signal, and the second power supply access pins of the signal access area B15 can be borrowed to provide the second voltage signal. However, the embodiment is not limited thereto. For example, at least part of the test signal access pins may be set to be electrically connected to the first power supply line and the second power supply line.

In some exemplary implementations, a plurality of first signal leads may be configured to transmit at least one of the following signals: a scan start signal, a scan clock signal, a light emitting start signal, a light emitting clock signal, a drive power supply signal, a test data signal, and a test control signal. For example, a plurality of first signal leads for transmitting a scan start signal, a scan clock signal, and a drive power supply signal may be electrically connected to the scan drive circuit. A plurality of first signal leads for transmitting a light emitting start signal, a light emitting clock signal and a drive power supply signal may be electrically connected with the light emitting drive circuit. A plurality of first signal leads for transmitting a test data signal and a test control signal may be electrically connected to the test circuit.

FIG. 8 is an exemplary trace diagram of a peripheral area according to at least one embodiment of the present disclosure. In some examples, as shown in FIG. 8, the second bezel B1 of the display substrate may be provided with a test circuit 313, the third bezel B3 may be provided with a scan drive circuit 23, and the fourth bezel B4 may be provided with a light emitting drive circuit 24. During an electronic test, a plurality of test signal access pins in the first test signal access area B16a of the first bezel B1 may supply a scan start signal (GSTV), a scan clock signal and a drive power supply signal to the scan drive circuit 23 through a plurality of first signal leads 341 extending towards the third bezel B3, and supply a test data signal and a test control signal to the test circuit 313 through a plurality of first signal leads 341. In the process of an electronic test, a plurality of test signal access pins in the second test signal access area B16b of the first bezel B1 may supply a light emitting start signal (ESV), a light emitting clock signal and a drive power supply signal to the light emitting drive circuit 24 through a plurality of first signal leads 341 extending towards the fourth bezel B4, and supply a test data signal and a test control signal to the test circuit 313 through a plurality of first signal leads 341. A plurality of first signal leads 341 may be electrically connected to the test circuit 313 within the second bezel B2 via the third bezel B3 or the fourth bezel B4. However, the embodiment is not limited thereto. In other examples, the third bezel and the fourth bezel may be each provided with a scan drive circuit and a light emitting drive circuit, and the test signal access pins can provide signals to the scan drive circuits in the third bezel and the fourth bezel respectively through a plurality of first signal leads, and provide signals to the light emitting drive circuits in the third bezel and the fourth bezel respectively.

In some examples, the plurality of first signal leads 341 may also be electrically connected to the signal access pins within the signal access area B15. For example, a plurality of first signal leads electrically connected to the signal access pins may provide a scan start signal, a scan clock signal, a light emitting start signal, a light emitting clock signal, and a drive power supply signal, so as to provide signals to the scan drive circuit and the light emitting drive circuit during a normal display process.

Figure 6:
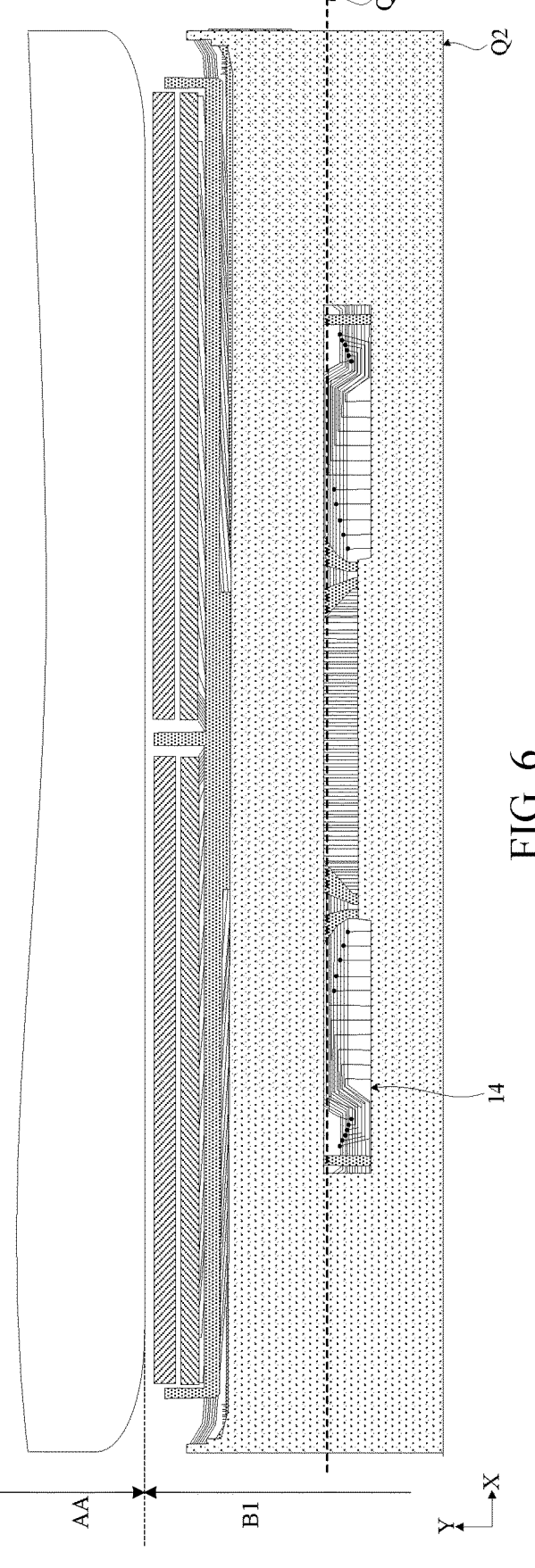
FIG. 6 is a schematic diagram of a first planarization layer of a first bezel according to at least one embodiment of the present disclosure.

FIG. 6 is a schematic diagram of a first planarization layer of a first bezel according to at least one embodiment of the present disclosure. In some examples, as shown in FIG. 6, during a preparation process of the display substrate, an encapsulation cover plate may be attached on the base substrate after the preparation of the encapsulation structure layer, and then cutting may be performed along a second cut path Q2 to obtain a single display substrate. The position of the second cut path Q2 may correspond to an edge of the single display substrate after cutting is performed. Cutting along a first cut path Q1 may remove part of the encapsulation cover plate, expose the signal access pins of the signal access area B15 and the test signal access pins 361 of the two test signal access areas. The exposed signal access pins can be bonded and connected with the flexible circuit board or the drive chip. The exposed test signal access pins 361 may be in contact with the test device for the electronic test. Connection positions of the first signal leads 341 and the test connection traces 342 may be located at a side of the first cut path Q1 away from the first encapsulation adhesive substrate, thereby avoiding a short circuit caused by the distance between the test connection trace and the first encapsulation adhesive substrate being too close.

In some examples, as shown in FIG. 6, the first bezel B1 may further be provided with a first planarization layer 14. The first planarization 14 of the black dot shaded area in FIG. 6 may be removed to expose a surface of the first source-drain metal layer. The first planarization 14 in the peripheral circuit area of the first bezel B1 may be retained, and the first planarization 14 in partial area of the test trace area may be retained. An orthographic projection of the first planarization layer 14 retained within the first bezel B1 on the base substrate can cover the connection positions of the plurality of first signal leads 341 and the plurality of test connection traces 342.

In some examples, as shown in FIG. 6, a distance between an edge of the first planarization layer 14 close to the display area AA and an edge of the first encapsulation adhesive substrate away from the display area AA may be greater than or equal to 50 microns, for example, the distance may be greater than or equal to 120 microns. In some examples, an orthographic projection of the first cut path Q1 on the base substrate may be overlapped with the first planarization 14. The first cut path Q1 may be located at a side of an edge of the first planarization 14 away from the display area AA and the edge of the first planarization 14 is an edge close to the display area AA. For example, the distance between the first cut path Q1 and the edge of the first encapsulation adhesive substrate away from the display area AA may be about 200 microns. However, the embodiment is not limited thereto.

In this example, by disposing the connection positions of the first signal leads 341 and the test connection traces 342 at a side of the first cut line Q1 away from the display area AA, and the connection positions can be covered and protected by the first planarization 14, the failure of the traces under the condition of high temperature and high humidity can be avoided, and the display abnormality caused by electrochemical corrosion can be avoided.

In some examples, as shown in FIG. 5, a side of the first test signal access area B16a away from the signal access area B15 in the first direction X may be provided with a first auxiliary mark 371. A side of the first auxiliary mark 371 away from the first test signal access area B16a in the first direction X may be provided with a second auxiliary mark 372. Similarly, a side of the second test signal access area B16b away from the signal access area B15 may also be provided with a first auxiliary mark 371 and a second auxiliary mark 372. For example, the dimension of the first auxiliary mark 371 may be smaller than the dimension of the second auxiliary mark 372. In some examples, orthographic projections of the first auxiliary mark 372 and the second auxiliary mark 372 on the base substrate may be cross-shaped. However, the embodiment is not limited thereto. For example, at least one of the first auxiliary mark and the second auxiliary mark may be L-shaped. In the present example, by providing the first auxiliary mark, it may be helpful in an accurate alignment of the test probe and the test signal access pins in the test signal access area during the electronic test. In other examples, it is possible to provide only the first auxiliary mark when the space of the first bezel is limited.

In some examples, as shown in FIG. 5, the first auxiliary mark 371 and the second auxiliary mark 372 may be of a same layer structure, for example, they may be located in the first source-drain metal layer. However, the embodiment is not limited thereto.

In some examples, as shown in FIG. 5, the first power supply line 321*a* may be electrically connected to a second auxiliary mark 372 through a first connection line 381. The first power supply line 321*b* may be electrically connected to another second auxiliary mark 372 through another first connection line 381. The first connection line 381 may extend along the second direction Y. For example, the first power supply line 321*a*, the first connection line 381 and the second auxiliary mark 372 may be of an integrated structure. However, the embodiment is not limited thereto.

Figures 9, 10, 11A:
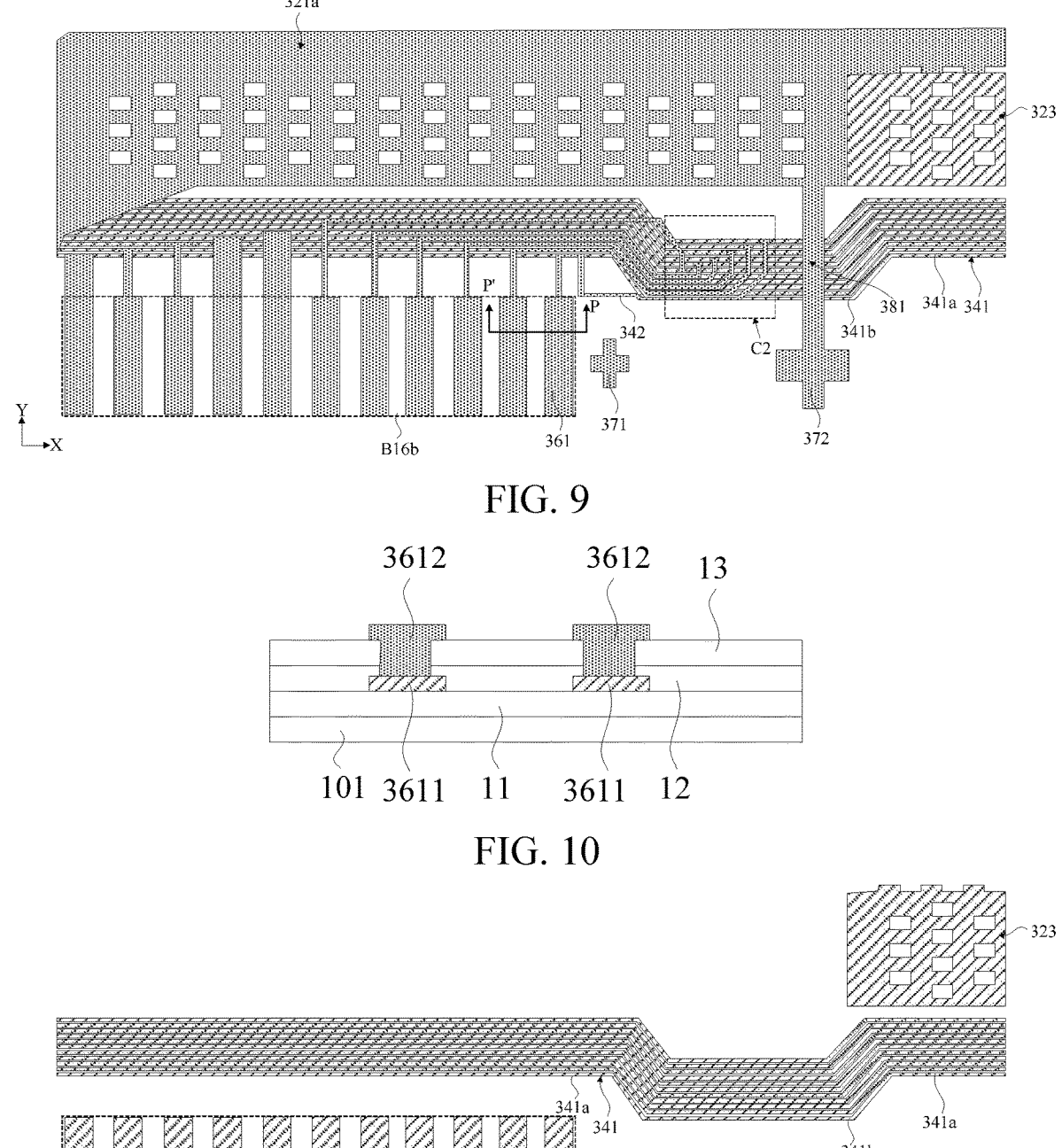
FIG. 9 is a partial enlarged schematic diagram of an area C1 in FIG. 5.
FIG. 10 is a partial sectional schematic diagram taken along a direction P-P' in FIG. 9.
FIG. 11A is a schematic diagram of a first gate metal layer in FIG. 9.
Figure 11B:
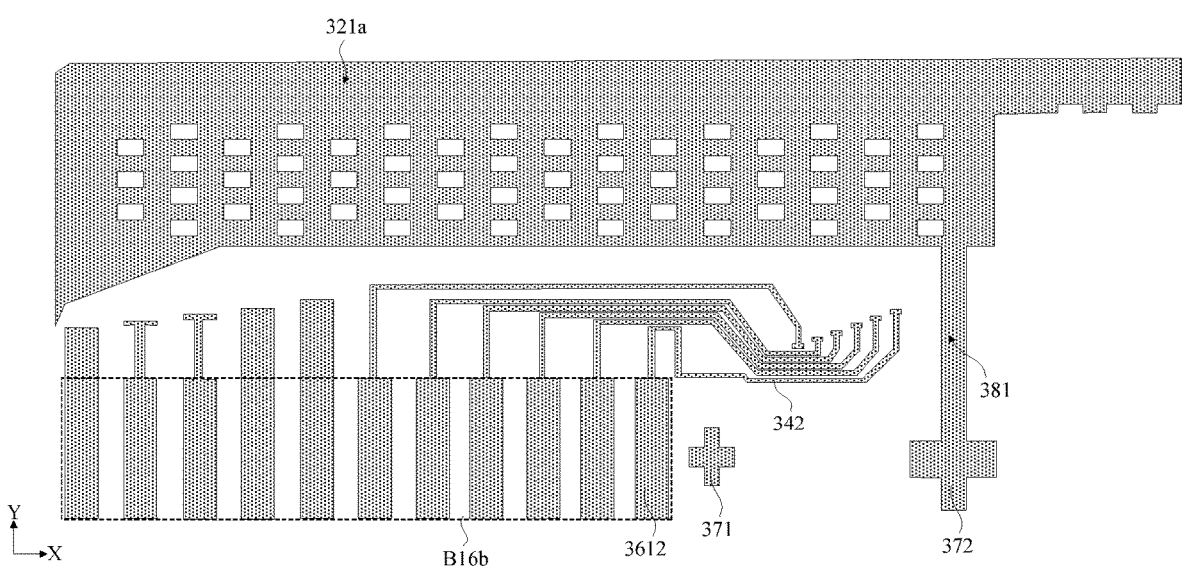
FIG. 11B is a schematic diagram of a first source and drain metal layer in FIG. 9.

In some examples, the structures of the left and right areas of the first bezel B1 may be substantially the same, and the following example will be explained by taking the right area of the first bezel B1 as an example. FIG. 9 is a partial enlarged schematic diagram of an area C1 in FIG. 5. FIG. 10 is a partial enlarged schematic diagram taken along a direction P-P' in FIG. 9. FIG. 11A is a schematic diagram of a first gate metal layer in FIG. 9. FIG. 11B is a schematic diagram of a first source and drain metal layer in FIG. 9.

In some examples, as shown in FIGS. 9 and 11A, the first signal lead 341 of the test trace area may include a first main body 341*a* and a first bending portion 341*b*. The first main body 341*a* may extend in the first direction X and the first bending portion 341*b* may protrude along the second direction Y toward a side of the second auxiliary mark 372. The first bending portion 341*b* may have a first extension portion, a second extension portion and a third extension portion which are connected sequentially. The first extension portion and the third extension portion may be connected to the first main body 341*a*, and the second extension is connected between the first extension portion and the third extension portion. The second extension portion may extend in the first direction X, and the extension directions of the first extension portion and the third extension portion may intersect with each other and may intersect with both the first direction X and the second direction Y. The first extension portion and the third extension portion extend towards a side away from the display area AA. An orthographic projection of the first bending portion 341*b* on the base substrate may have a groove shape. In this example, a plurality of first signal leads 341 may all be located in the test trace area. However, the embodiment is not limited thereto. In other examples, the first bending portion 341*b* of at least one first signal lead 341 may extend to be overlapped with the second auxiliary mark 372, or may extend to an area located at a side of the second auxiliary mark 372 away from the first test signal access area B16*b* in the first direction X.

In some examples, as shown in FIGS. 9, 11A and 11B, a plurality of test connection traces 342 and a plurality of first signal leads 341 may be electrically connected in one-to-one correspondence. For example, a portion of the test connection traces 342 may be electrically connected to the first bending portions 341*b* of the corresponding first signal leads 341, for example, they may be electrically connected to the second extension portions of the first bending portions 341*b*. In some examples, the test signal access pins 361 within the first test signal access area B16*b* close to the first auxiliary mark 371 may be electrically connected to the first signal leads 341 close to the first adhesive substrate, and the test signal access pins 361 away from the first auxiliary mark 371 may be electrically connected to the first signal leads 341 away from the first adhesive substrate. The test connection traces 342 electrically connected to the test signal access pins 361 close to the first auxiliary mark 371 may be electrically connected to the first bending portions 341*b* of the corresponding first signal leads 341. The test connection lines 342 electrically connected to the test signal access pins 361 away from the first auxiliary mark 371 may extend in the second direction Y and then be electrically connected to the first main bodies 341*a* of the corresponding first signal leads 341. In this example, the connection positions of the plurality of test connection traces 342 and the plurality of first signal leads 341 may be located at a side of the first connection line 381 close to the first auxiliary mark 371 in the first direction X. However, the embodiment is not limited thereto. In other examples, the connection position of the at least one test connection trace and the at least one first signal lead may be located at a side of the first connection line 381 away from the first auxiliary mark 371 in the first direction X when the space of the first bezel is sufficient.

In some examples, as shown in FIG. 10, the test signal access pins 361 may include a first sub-pin 3611 and a second sub-pin 3612. The first sub-pin 3611 and the second sub-pin 3612 may be electrically connected to each other. The first sub-pin 3611 may be located in the first gate metal layer, and the second sub-pin 3612 may be located in the first source-drain metal layer. The second sub-pin 3612 may be electrically connected to the first sub-pin 3611 through a groove provided by the third insulation layer 13 and the second insulation layer 12. An orthographic projection of the second sub-pin 3612 on the base substrate 101 may include an orthographic projection of the first sub-pin 3611 on the base substrate 101. The second sub-pin 3612 and the corresponding test connection trace 342 electrically connected may be of an integrated structure.

In some examples, as shown in FIGS. 9, 11A and 11B, the first connection line 381 may extend in the second direction Y and may be electrically connected with the first power supply line 321*a* and the second auxiliary mark 371. The first connection line 381 may be aligned with the second auxiliary mark 372 in the second direction Y. For example, a centerline of the first connection line 381 along the first direction X may be aligned with a centerline of the second auxiliary mark 372 along the first direction X. In some examples, the first connection line 381, the first power supply line 321*a* and the second auxiliary mark 371 may be of an integrated structure, for example, they may be located in the first source-drain metal layer. A plurality of first signal leads 341 may be located in the first gate metal layer. An orthographic projection of the first connection line 381 on the base substrate may be overlapped with orthographic projections of the plurality of first signal leads 341 on the base substrate. The orthographic projection of the first connection line 381 on the base substrate may be overlapped with orthographic projections of the first bending portions 341*b* of the plurality of first signal leads 341 on the base substrate. The first connection line 381 may be located at a side of the plurality of test connection traces 342 in the first direction X. In this example, the first connection line 381 is located at a side of the plurality of test connection traces 342 and the plurality of test signal access pins 361 close to the first bezel area in the first direction X. That is, the first connection line 381 may be located at the periphery of the plurality of test connection lines 342 and the plurality of test signal access pins 361 in the first direction X, which may provide an electrostatic lead-out path to reduce the damage of electrostatic to the signal traces, and may provide protection to the test signal access pins, thereby improving the antistatic capability of the display substrate.

Figure 12:
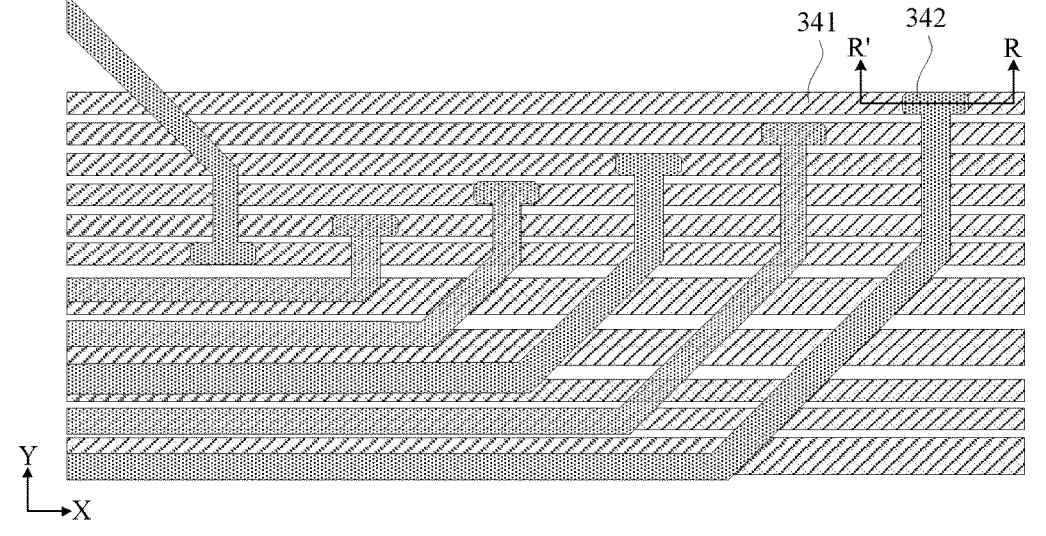
FIG. 12 is a partial enlarged schematic diagram of an area C2 in FIG. 9.
Figure 13:
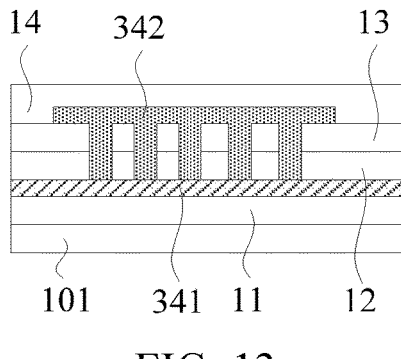
FIG. 13 is a partial sectional schematic diagram taken along an R-R' direction in FIG. 12.

FIG. 12 is a partial enlarged schematic diagram of an area C2 in FIG. 9. FIG. 13 is a partial sectional schematic diagram taken along an R-R' direction in FIG. 12. In some examples, as shown in FIGS. 12 and 13, a connection end for the test connection trace 342 and the first signal lead 341 may be T-shaped. At least one test connection trace 342 may extend in the second direction Y towards a side away from the display area AA and then extend in the first direction X, until connected to the second sub-pin 3612 of the test signal access pin 361. At least one test connection trace 342 may extend in the second direction Y toward a side close to the display area AA and then extend in the first direction X, until connected to the second sub-pin 3612 of the test signal access pin 361.

In some examples, as shown in FIG. 3, the first signal leads 341 may be located in the first gate metal layer and the test connection traces 342 may be located in the first source-drain metal layer. However, the embodiment is not limited thereto.

A structure of the display substrate according to the present disclosure will be described below through an example of a preparation process of the display substrate. A "patterning process" mentioned in the present disclosure includes processes such as film layer deposition, photoresist coating, mask exposure, development, etching, and photoresist stripping. The deposition may be any one or more of sputtering, evaporation, and chemical vapor deposition, the coating may be any one or more of spray coating and spin coating, and the etching may be any one or more of dry etching and wet etching. A "thin film" refers to a layer of a thin film prepared from a material on a base substrate using a process of deposition or coating. If the "thin film" does not need a patterning process in an entire manufacturing process, the "thin film" may also be called a "layer". If the "thin film" needs a patterning process in the entire manufacturing process, the "thin film" is called a "thin film" before the patterning process and is called a "layer" after the patterning process. The "layer" after the patterning process includes at least one "pattern".

"A and B are of a same layer structure" mentioned in the present disclosure means that A and B are formed simultaneously through a same patterning process. A "same layer" does not always mean that thicknesses of layers or heights of layers are the same in a section diagram. "An orthographic projection of A contains an orthographic projection of B" means that the orthographic projection of B falls within a range of the orthographic projection of A, or the orthographic projection of A covers the orthographic projection of B.

In some exemplary implementations, the process for preparing a display substrate of the embodiment may include following acts.

(1) Providing a base substrate. In some examples, the base substrate 101 may be a rigid substrate, e.g., a glass substrate. However, the embodiment is not limited thereto. For example, the base substrate may be a flexible substrate.

(2) Preparing an encapsulation layer. In some examples, a semiconductor thin film is deposited on the base substrate 101, and the semiconductor thin film is patterned through a patterning process to form a semiconductor layer. As shown in FIG. 3, the semiconductor layer of the display area at least may include active layers of transistors of the pixel unit.

(3) Preparing a first gate metal layer. In some examples, a second insulation thin film and a first metal thin film are sequentially deposited on the base substrate 101 on which the aforementioned structures are formed. The first metal thin film is patterned through a patterning process to form a first insulation layer 11 covering the semiconductor layer and a first gate metal layer disposed on the first insulation layer 11. As shown in FIG. 3, the first gate metal layer of the display area at least includes a gate electrode of a transistor and a first capacitor electrode of a storage capacitor of a pixel circuit. As shown in FIG. 5, the first gate metal layer of the first bezel may at least include a plurality of data fan-out lines 333, a first peripheral power supply connection line 323, a plurality of first signal leads 341, first sub-pins of a plurality of signal access pins located in the signal access area B15, and first sub-pins of a plurality of test signal access pins 361 located in the test signal access area.

(4) Preparing a second gate metal layer. In some examples, a second insulation thin film and a second metal thin film are sequentially deposited on the base substrate on which the aforementioned structures are formed, and the second metal thin film is patterned through a patterning process to form a second insulation layer 12 and a second gate metal layer disposed on the second insulation layer 12. As shown in FIG. 3, the second gate metal layer of the display area may at least include a second capacitor electrode of a storage capacitor of the pixel circuit.

(5) Preparing a third insulation layer. In some examples, a third insulation thin film is deposited on the base substrate 101 on which the aforementioned structures are formed, and the third insulation thin film is patterned through a patterning process to form a third insulation layer. The third insulation layer 13 is provided with a plurality of vias or grooves.

(6) Preparing a first source-drain metal layer. In some examples, a third metal thin film is deposited on the base substrate 101 on which the aforementioned structures are formed, and the third metal thin film is patterned through a patterning process to form a first source-drain metal layer. As shown in FIG. 3, the first source-drain metal layer of the display area may at least include source electrodes and drain electrodes of a plurality of transistors of a pixel circuit. As shown in FIG. 5, the first source-drain metal layer of the first bezel may at least include first power supply lines 321a and 321b, a second power supply line 322, a plurality of test connection traces 342, a first auxiliary mark 371, a second auxiliary mark 372, second sub-pins of a plurality of signal access pins located in the signal access area, and second sub-pins of a plurality of test signal access pins 361 located in the test signal access area. The test connection traces 342 may be electrically connected to the first signal leads 341 through vias opened in the third insulation layer and the second insulation layer. The second sub-pins of the test signal access pins 361 may be electrically connected to the corresponding first sub-pins through grooves provided by the third insulation layer and the second insulation layer. The second sub-pins of the signal access pins can be electrically connected with the corresponding first sub-pins through grooves provided by the third insulation layer and the second insulation layer.

At this moment, the preparation of a circuit structure layer in the display area on the base substrate 101 is completed, as shown in FIG. 3. In some examples, the first insulation thin film to the third insulation thin film may all be made of inorganic material, such as any one or more of silicon oxide (SiOx), silicon nitride (SiNx) and silicon oxynitride (SiON), and may be a single-layer, a multi-layer or a composite layer.

(7) Preparing a planarization layer, a light emitting structure layer and an encapsulation structure layer in sequence on the base substrate. In some exemplary implementations, a first planarization thin film is coated on the base substrate 101 on which the aforementioned structures are formed, and a first planarization layer 14 is formed through a patterning process. Part of the first planarization 14 is retained within the first bezel B1 to cover the connection positions for the test connection traces 342 and the first signal leads 341.

Then, a first conductive thin film is deposited in the display area, and the first conductive thin film is patterned through a patterning process to form a pattern of an anode layer. The anodes of the anode layer can be electrically connected with the pixel circuits through vias on the first planarization layer. Then, coating is performed with a pixel definition thin film, and a pattern of a pixel definition layer is formed by masking, exposure and development processes. The pixel definition layer is formed in the display area. The pixel opening is provided on the pixel definition layer in the display area. The pixel definition thin film in the pixel opening is removed by development to expose the surface of the anode. Subsequently, an organic light emitting layer and a cathode are sequentially formed on the base substrate on which the aforementioned patterns are formed. For example, the organic light emitting layer includes a hole injection layer, a hole transport layer, a light emitting layer, an electron transport layer, and an electron injection layer that are stacked, and is formed in the pixel opening of the display area, to connect the organic light emitting layer to the anode. A part of the cathode is formed on the organic light emitting layer.

In some examples, an encapsulation structure layer is formed on the base substrate on which the abovementioned patterns are formed. The encapsulation structure layer may be formed in the display area, and may adopt a stacked structure of inorganic material/organic material/inorganic material. An organic material layer is disposed between two inorganic material layers.

In some exemplary implementations, the first planarization layer and the pixel definition layer may be made of organic material, such as polyimide, acrylic, or polyethylene terephthalate.

In the abovementioned preparation process, preparation processes of a scan drive circuit and a light emitting drive circuit of the bezel area is similar to the preparation process of the circuit structure layer in the display area, and thus will not be elaborated herein.

In some examples, after the preparation of the encapsulation structure layer is completed, the encapsulation cover plate can be attached with the base substrate by an encapsulation process, then a single display substrate can be obtained by cutting, and the encapsulation cover plate is cut according to the first cut path to expose the signal access pins of the signal access area and the test signal access pins of the test signal access area. In some examples, a side of the encapsulation cover plate away from the base substrate may be provided with a touch structure layer to form a touch display substrate. However, the embodiment is not limited thereto.

The preparation process according to the exemplary embodiment may be achieved using an existing mature preparation device, and may be well compatible with an existing manufacturing process. The process is simple to achieve, easy to implement, high in an efficiency of production, low in a production cost, and high in a yield.

The structure of the display substrate according to the exemplary embodiment and the preparation process thereof are described only illustratively. In some exemplary implementations, a corresponding structure may be changed and a patterning process may be increased or decreased according to actual needs. For example, the display area may be provided with a first source-drain metal layer and a second source-drain metal layer, the first source-drain metal layer may include source electrodes and drain electrodes of transistors, and the second source-drain metal layer may include connection electrodes between light emitting elements and the drain electrodes of the transistors. At this time, the first power supply line, the second power supply line and the test connection traces may be located in the second source-drain metal layer; or, the first power supply line and the second power supply line may be located at the second source-drain metal layer, and the test connection traces may be located at the first source-drain metal layer. However, the embodiment is not limited thereto.

Figure 14:
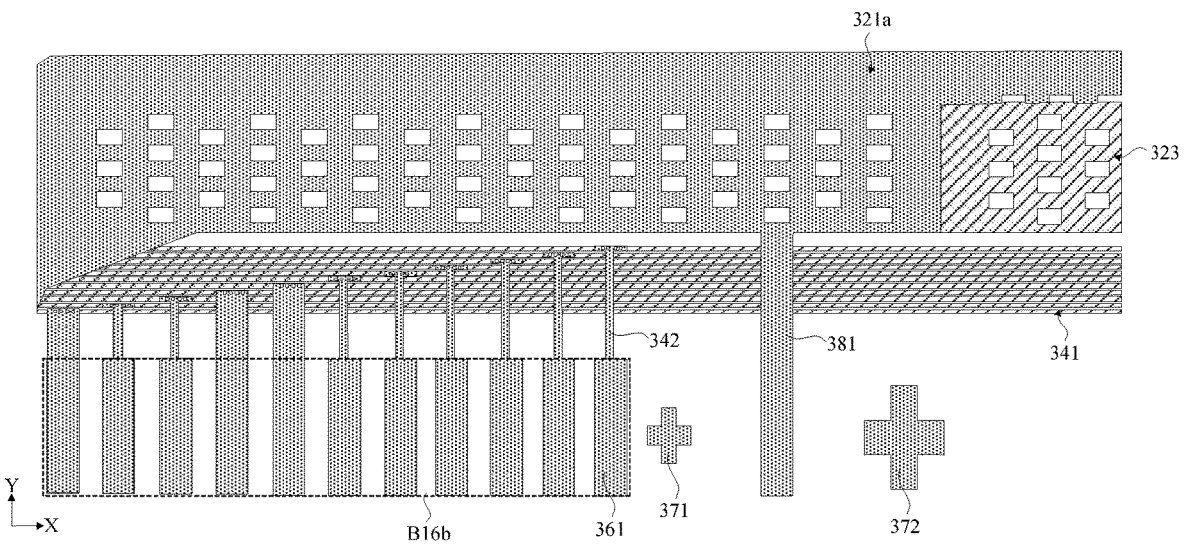
FIG. 14 is another partial enlarged schematic diagram of a first bezel according to at least one embodiment of the present disclosure.
Figure 15:
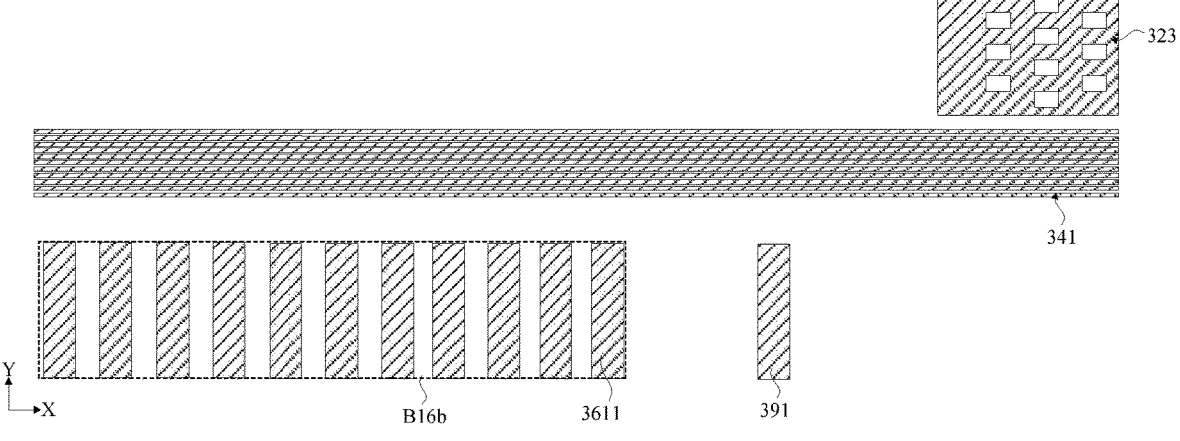
FIG. 15 is a schematic diagram of a first gate metal layer in FIG. 14.

FIG. 14 is another partial enlarged schematic diagram of the first bezel according to at least one embodiment of the present disclosure. FIG. 15 is a schematic diagram of a first gate metal layer in FIG. 14. In the example, the right area of the first bezel is exemplified for illustration and description. The structure of the left area of the first bezel is similar to the structure of the right area of the first bezel, so it will not be repeated here.

In some examples, as shown in FIGS. 14 and 15, a plurality of first signal leads 341 may extend in the first direction X in the test trace area, and a plurality of test connection traces 342 may extend in a second direction Y. One end of the test connection trace 342 may be electrically connected to the first signal lead 341, and the other end of the test connection trace 342 may be electrically connected to the test signal access pin 361 of the test signal access area B16b, for example, the other end of the test connection trace 342 and the second sub-pin of the test signal access pin 361 may be of an integrated structure. However, the embodiment is not limited thereto.

In some examples, as shown in FIGS. 14 and 15, the display substrate may also include an auxiliary power supply pin 391 located in the first gate metal layer. The auxiliary power supply pin 391 may be located at a side of the test signal access area away from the signal access area in the first direction X. The auxiliary power supply pin 391 may be aligned with the test signal access pin 361 in the first direction X. For example, a centerline of the auxiliary power supply pin 391 in the second direction Y may be aligned with a centerline of the test signal access pin 361 in the second direction Y. The auxiliary power supply pin 391 and the first sub-pins 3611 of the test signal access pins 361 are of a same layer structure, and the shapes and sizes of the two may be substantially the same. An orthographic projection of the auxiliary power supply pin 391 on the base substrate may be located between orthographic projections of the first auxiliary mark 371 and the second auxiliary mark 372 on the base substrate. One end of the first connection line 381 may be electrically connected to the auxiliary power supply pin 391 through a groove provided through the third insulation layer and the second insulation layer, and the other end of the first connection line 381 may be electrically connected to the first power supply line 321a. The first connection line 381 and the first power supply line 321a may be of an integrated structure. The first connection line 381 may be a strip-shaped trace extending along the second direction Y.

In this example, by providing an auxiliary power supply pin between the first auxiliary mark and the second auxiliary mark, and electrically connecting the auxiliary power supply pin with the first power supply pin through the first connection line, an electrostatic lead-out path can be provided on the periphery of a plurality of test connection traces and test signal access pins, which can reduce the damage of electrostatic to the signal traces and provide protection for the test signal access pins, thereby improving the antistatic ability of the display substrate.

Rest of the structure of the display substrate according to the embodiment may be referred to descriptions of the aforementioned embodiments, and will not be repeated here.

Figure 16:
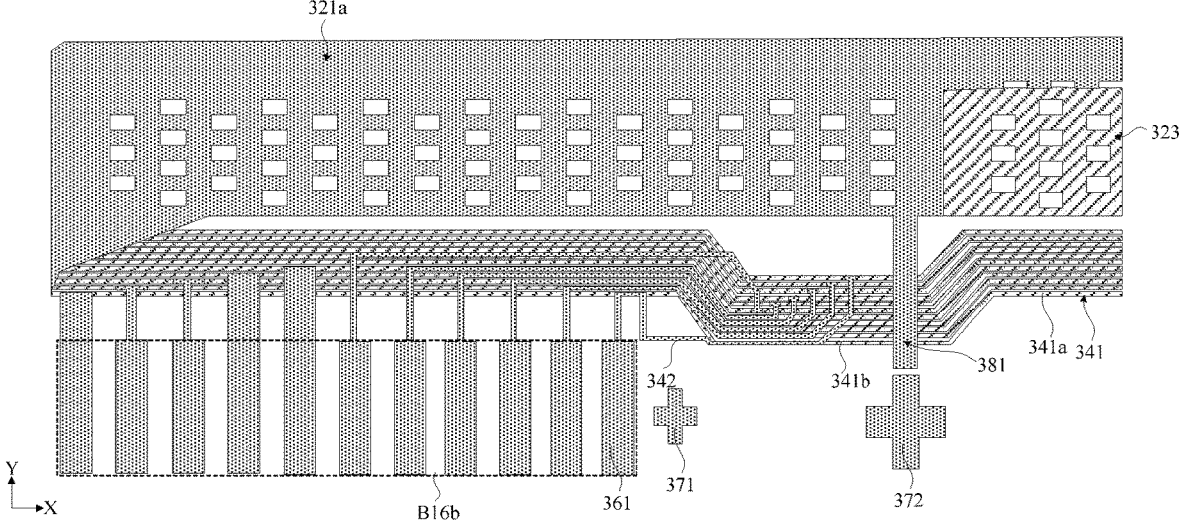
FIG. 16 is another partial enlarged schematic diagram of a first bezel according to at least one embodiment of the present disclosure.

FIG. 16 is another partial enlarged schematic diagram of the first bezel according to at least one embodiment of the present disclosure. In some examples, as shown in FIG. 16, the first connection line 381 may be disconnected with the second auxiliary mark 372. The first connection line 381 may be aligned with the second auxiliary mark 372 in the second direction Y, and the first connection line 381 may not be electrically connected with the second auxiliary mark 372. In the example, the first connection line 381 is located at the periphery of the plurality of test connection traces 342 and the plurality of test signal access pins 361 in the first direction X, which can reduce the damage of static electricity to the signal traces and provide protection to the test signal access pins, thereby improving the antistatic capability of the display substrate. Rest of the structure of the display substrate according to the embodiment may be referred to descriptions of the aforementioned embodiments, and will not be repeated here.

Figure 17:
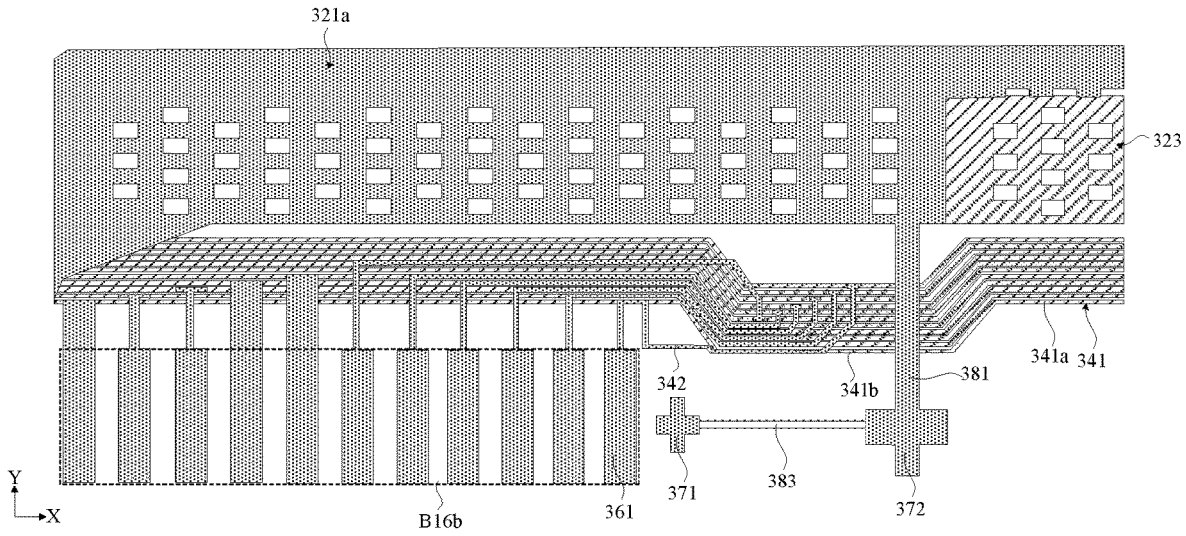
FIG. 17 is another partial enlarged schematic diagram of a first bezel according to at least one embodiment of the present disclosure.

FIG. 17 is another partial enlarged schematic diagram of the first bezel according to at least one embodiment of the present disclosure. In some examples, as shown in FIG. 17, the first connection line 381 may be electrically connected with the second auxiliary mark 372. The second auxiliary mark 372 may be electrically connected to the first auxiliary mark 371 through a third connection line 383. The third connection line 383 may extend along the first direction X. In some examples, the second auxiliary mark 372, the first auxiliary mark 371 and the third connection line 383 may be of a same layer structure, for example, they may all located in the first source-drain metal layer. For example, the second auxiliary mark 372, the first auxiliary mark 371 and the third connection line 383 may be of an integrated structure. However, the embodiment is not limited thereto. For example, the third connection line may be located at a side of the first auxiliary mark and the second auxiliary mark close to the base substrate, for example, the third connection line may be located on the first gate metal layer. In this example, by electrically connecting the first auxiliary mark and the second auxiliary mark through the third connection line, it is possible to further surround a signal trace electrically connected with a test signal access pin, and reduce the damage of static electricity to the signal trace, thereby improving the antistatic ability of the display substrate. Rest of the structure of the display substrate according to the embodiment may be referred to descriptions of the aforementioned embodiments, and will not be repeated here.

Figure 18:
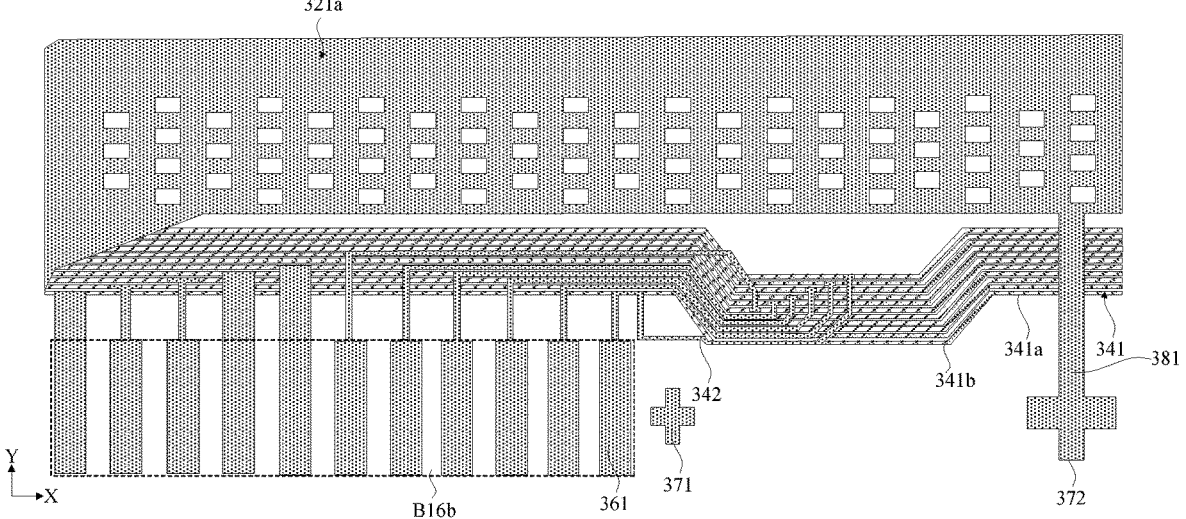
FIG. 18 is another partial enlarged schematic diagram of a first bezel according to at least one embodiment of the present disclosure.

FIG. 18 is another partial enlarged schematic diagram of the first bezel according to at least one embodiment of the present disclosure. In some examples, as shown in FIG. 18, the first connection line 381 may be electrically connected with the second auxiliary mark 372. An orthographic projection of the first connection line 381 on the base substrate may be overlapped with orthographic projections of first bodies 341a of the plurality of first signal leads 341 on the base substrate The first bending portions 341b of the plurality of first signal leads 341 may be located at a side of the first connection line 381 close to the second test signal access area B16b in the first direction X. Rest of the structure of the display substrate according to the embodiment may be referred to descriptions of the aforementioned embodiments, and will not be repeated here.

Figure 19:
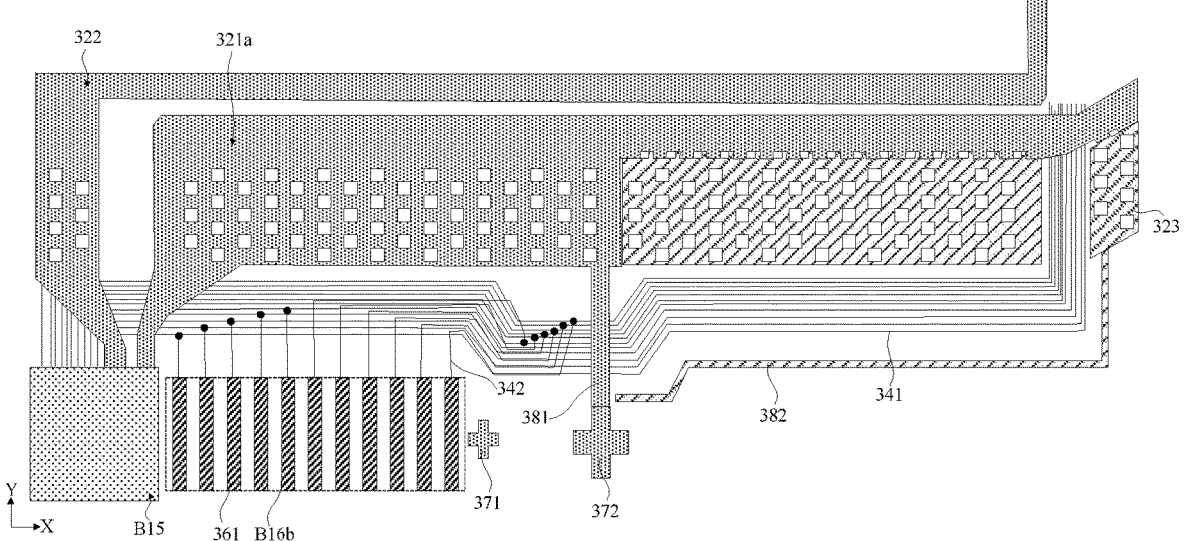
FIG. 19 is another partial enlarged schematic diagram of a first bezel according to at least one embodiment of the present disclosure.

FIG. 19 is another partial enlarged schematic diagram of the first bezel according to at least one embodiment of the present disclosure. In some examples, as shown in FIG. 19, the first peripheral power supply connection line 323 located in the first gate metal layer may be electrically connected with the second connection line 382, for example, the first peripheral power supply connection line 323 and the second connection line 382 may be of an integrated structure. A portion of the first peripheral power supply connection line 323 close to the fourth bezel may be electrically connected with the second connection line 382. The second connection line 382 may extend from the first peripheral power supply connection line 323 in the second direction Y towards a side away from the display area, and then extend in the first direction X towards a side close to the test signal access area, until close to the first connection line 381. In some examples, the second connection line 382 may not be electrically connected to the first connection line 381. However, the embodiment is not limited thereto. For example, the second connection line 382 may be electrically connected with the first connection line 381.

In some examples, as shown in FIG. 19, the second connection line 382 may be located at a side of the plurality of first signal leads 341 away from the display area. The second connection line 382 may be located at a side of the plurality of first signal leads 341 close to an edge of the first bezel. The second connection line 382 may surround the outer side of the plurality of first signal leads 341. The second connection line 382 of the present example may provide an electrostatic discharge path and may also provide protection to the first signal leads, thereby improving the antistatic capability of the display substrate. Rest of the structure of the display substrate according to the embodiment may be referred to descriptions of the aforementioned embodiments, and will not be repeated here.

Figure 20:
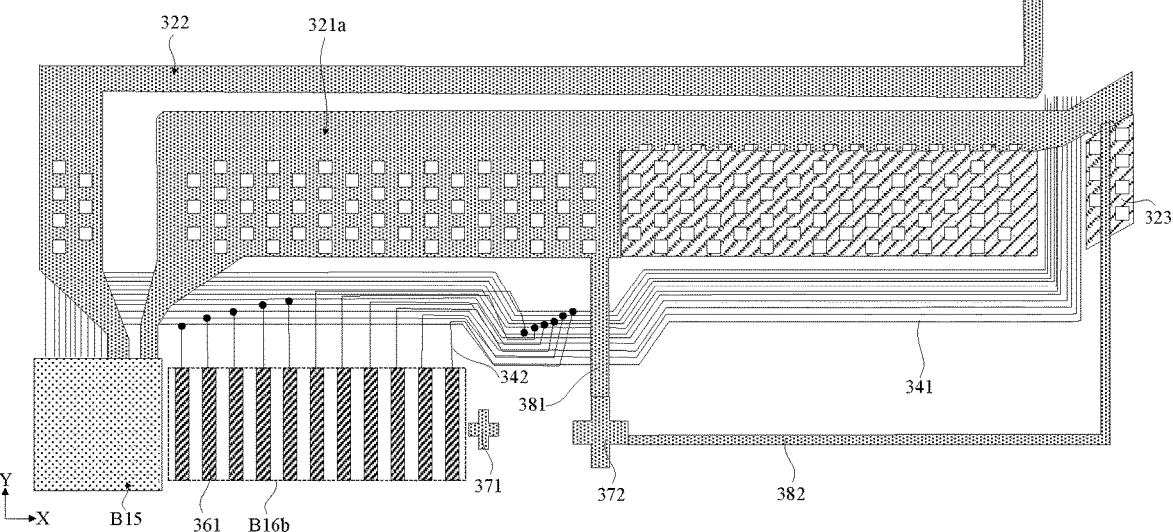
FIG. 20 is another partial enlarged schematic diagram of a first bezel according to at least one embodiment of the present disclosure.

FIG. 20 is another partial enlarged schematic diagram of the first bezel according to at least one embodiment of the present disclosure. In some examples, as shown in FIG. 20, the first power supply line 321a located in the first source-drain metal layer may be electrically connected with the second connection line 382, for example, the first power supply line 321a and the second connection line 382 may be of an integrated structure. A portion of the first power supply line 321a close to the fourth bezel may be electrically connected with the second connection line 382. The second connection line 382 may extend from the first power supply line 321a in the second direction Y towards a side away from the display area and then extend in the first direction X towards a side close to the test signal access area, until close to the second auxiliary mark 372. In some examples, the second connection line 382 may be electrically connected to the second auxiliary mark 372. However, the embodiment is not limited thereto. For example, the second connection line 382 may not be electrically connected to the second auxiliary mark 372. The embodiment can effectively improve the antistatic ability of the display substrate. Rest of the structure of the display substrate according to the embodiment may be referred to descriptions of the aforementioned embodiments, and will not be repeated here.

In other examples, the above embodiments may be combined with each other. For example, the first connection line and the second connection line may be connected to the first power supply line and the second auxiliary mark, and the first auxiliary mark may be electrically connected to the second auxiliary mark through the third connection line. As another example, the first connection line may not be electrically connected to the second auxiliary mark, and the second connection line may be electrically connected to the second auxiliary mark. However, the embodiment is not limited thereto.

An embodiment of the present disclosure further provides a display apparatus including the display substrate of the above embodiments. The display substrate may be an OLED display substrate. The display apparatus may be any product or component with a display function, such as an OLED display apparatus, a mobile phone, a tablet computer, a television, a display, a notebook computer, a digital photo frame, and a navigator. However, the embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising:

a base substrate, at least comprising a display area and a peripheral area located at a side of the display area;

a first power supply line, located at the peripheral area;

a plurality of first signal leads, a plurality of test connection traces, a plurality of test signal access pins and at least one first connection line, located at a side of the first power supply line away from the display area, wherein at least one first signal lead is electrically connected with at least one test signal access pin through at least one test connection trace;

wherein the first connection line is located at a side of the plurality of test connection traces and the plurality of test signal access pins close to an edge of the peripheral area in a first direction, the first connection line extends at least in a second direction and is electrically connected with the first power supply line, the first direction intersects with the second direction.

2. The display substrate according to claim 1, wherein, in a direction perpendicular to the display substrate, the first connection line, the first power supply line and the plurality of test connection traces are located at a side of the plurality of first signal leads away from the base substrate.

3. The display substrate according to claim 2, wherein, the first connection line, the first power supply line and the plurality of test connection traces are of a same layer structure.

4. The display substrate according to claim 1, wherein, an orthographic projection of the first connection line on the base substrate is overlapped with orthographic projections of the plurality of first signal leads on the base substrate.

5. The display substrate according to claim 1, wherein the peripheral area at least comprises: at least one test signal access area, at least one first auxiliary mark, and at least one second auxiliary mark which are located at a side of the display area; the second auxiliary mark is located at a side of the first auxiliary mark away from the test signal access area in the first direction;

the first connection line is aligned with the second auxiliary mark in the second direction.

6. The display substrate according to claim 5, wherein the first connection line is electrically connected with the second auxiliary mark.

7. The display substrate according to claim 6, wherein the first connection line and the second auxiliary mark are of an integrated structure.

8. The display substrate according to claim 1, wherein the peripheral area at least comprises: at least one test signal access area, at least one first auxiliary mark, and at least one second auxiliary mark which are located at a side of the display area; the second auxiliary mark is located at a side of the first auxiliary mark away from the test signal access area in the first direction;

the first connection line is located between the first auxiliary mark and the second auxiliary mark in the first direction.

9. The display substrate according to claim 8, further comprising: at least one auxiliary power supply pin located between the first auxiliary mark and the second auxiliary mark in the first direction, wherein the first connection line is electrically connected to the auxiliary power supply pin.

10. The display substrate according to claim 5, wherein the at least one first signal lead has a first bending portion protruding toward a side of the second auxiliary mark; the at least one test connection trace is electrically connected with the first bending portion of the first signal lead;

an orthographic projection of the first connection line on the base substrate is overlapped with an orthographic projection of the first bending portion of the first signal lead on the base substrate.

11. The display substrate according to claim 5, wherein the at least one first signal lead has a first bending portion protruding toward a side of the second auxiliary mark; the at least one test connection trace is electrically connected with the first bending portion of the first signal lead;

an orthographic projection of the first connection line on the base substrate is not overlapped with an orthographic projection of the first bending portion of the first signal lead on the base substrate, and the first bending portion of the first signal lead is located at a side of the first connection line close to the test signal access area.

12. The display substrate according to claim 5, wherein the first auxiliary mark is electrically connected with an adjacent second auxiliary mark through a third connection line.

13. The display substrate according to claim 12, wherein the first auxiliary mark, the third connection line and the second auxiliary mark are of an integrated structure.

14. The display substrate according to claim 5, wherein the peripheral area further comprises a first area located between the display area and the test signal access area;

the plurality of test signal access pins are located at the test signal access area, and the first power supply line, the plurality of first signal leads and the plurality of test connection traces are at least located at the first area.

15. The display substrate according to claim 5, wherein the peripheral area further comprises a signal access area located at a side of the display area along the second direction, the signal access area is adjacent to the test signal access area in the first direction; the signal access area comprises a plurality of signal access pins disposed on the base substrate; the at least one first signal lead is electrically connected with at least one signal access pin.

16. The display substrate according to claim 1, further comprising a second connection line electrically connected with the first power supply line, wherein the second connection line is located at a side of the plurality of first signal leads away from the display area.

17. The display substrate according to claim 16, wherein the second connection line and the first power supply line are of an integrated structure.

18. The display substrate according to claim 16, further comprising a first peripheral power supply connection line electrically connected with the first power supply line, wherein the first peripheral power supply connection line is located at a side of the first power supply line close to the base substrate; the second connection line and the first peripheral power supply connection line are of an integrated structure.

19. The display substrate according to claim 1, wherein the plurality of first signal leads are configured to transmit at least one of the following signals: a scan start signal, a scan clock signal, a light emitting start signal, a light emitting clock signal, a drive power supply signal, a test data signal, and a test control signal.

20. A display apparatus, comprising the display substrate of claim 1.

\* \* \* \* \*